US012644911B2

(12) United States Patent
Letor et al.

(10) Patent No.: US 12,644,911 B2
(45) Date of Patent: Jun. 2, 2026

(54) MONITORING CIRCUIT AND CORRESPONDING METHOD

(71) Applicant: STMicroelectronics International N.V., Geneva (CH)

(72) Inventors: Romeo Letor, Mascalucia (IT); Veronica Puntorieri, San Giovanni La Punta (IT)

(73) Assignee: STMicroelectronics International N.V., Geneva (CH)

( * ) Notice: Subject to any disclaimer, the term of this patent is extended or adjusted under 35 U.S.C. 154(b) by 68 days.

(21) Appl. No.: 18/744,420

(22) Filed: Jun. 14, 2024

(65) Prior Publication Data

US 2025/0004020 A1 Jan. 2, 2025

(30) Foreign Application Priority Data

Jun. 30, 2023 (IT) ......................... 102023000013689

(51) Int. Cl.
  *G01R 19/165* (2006.01)
  *G01R 31/26* (2020.01)
  (Continued)

(52) U.S. Cl.
  CPC ... *G01R 19/16519* (2013.01); *G01R 31/2621* (2013.01); *H03K 17/0822* (2013.01); *H03K 17/302* (2013.01)

(58) Field of Classification Search
  CPC .......... G01R 19/16519; G01R 31/2621; H03K 17/0822; H03K 17/302
  See application file for complete search history.

(56) References Cited

U.S. PATENT DOCUMENTS 8,896,349 B2 * 11/2014 Vilas Boas ............ G01R 19/32
                                                        327/513
11,474,552 B2 * 10/2022 Kundu .................... G05F 3/242
(Continued)

FOREIGN PATENT DOCUMENTS

DE        102021214971 A1     6/2023

*Primary Examiner* — Menatoallah Youssef
*Assistant Examiner* — Khareem E Almo
(74) *Attorney, Agent, or Firm* — Seed Intellectual Property Law Group LLP

(57) ABSTRACT

A circuit for monitoring an actual threshold voltage value of a MOSFET is provided. The circuit includes a current source configured to be coupled to a source terminal of the MOSFET and to generate a test current; a voltage generator configured to be coupled between a gate terminal of the MOSFET and the source terminal of the MOSFET, and to generate a test voltage, said test voltage being lower than a nominal threshold voltage value of the MOSFET; a detection unit configured to sample a plurality of voltage value at the source terminal of the MOSFET during time, to compute as a function of said plurality of voltage value at least a value of voltage variation over time, in particular over a given time period, of said voltage value at the source terminal of the MOSFET, and to provide said computed at least a value of voltage variation to an alarm generation unit; the alarm generation unit being configured to receive said computed voltage variation from the detection unit, to compare said computed voltage variation with a reference voltage, and to raise an alarm if the output of said comparison does not correspond to a predetermined output condition; and a control unit, configured to receive a test mode signal, indicative of an operation mode. The control unit is further configured to, according to said received test mode signal, select the status of coupling or decoupling of said current source to/from the source terminal of the MOSFET, determine the value of said reference voltage, set said output (Continued)

MC
104 402 406 100
$C_{ON/OFF}$
404
$D_{GD}$
TM
$V_{EQ}$
TE
$S_{VLOAD,TO}$
$S_{VLOAD,T4}$
$C_{LTEST}$
400
408
410
420
$I_{TEST}$
200
412
414
416
418
$AL_{VTH}$
$R_{LOAD}$ $C_{LOAD}$
302 304
300
$V_{LOAD}$
202
$V_S$
40 condition of said comparison, and signal to the detection unit
to perform a plurality of said sampling operation.

17 Claims, 11 Drawing Sheets

(51) Int. Cl.
*H03K 17/082* (2006.01)
*H03K 17/30* (2006.01)

(56) References Cited

U.S. PATENT DOCUMENTS

| | | | |
|---|---|---|---|
| 12,085,601 B2 * | 9/2024 | Letor | ................. G01R 31/2621 |
| 12,146,923 B2 * | 11/2024 | Aichriedler | ........ G01R 31/3277 |
| 2009/0085610 A1 * | 4/2009 | Westwick | ................ H03K 5/24 |
| | | | 327/68 |
| 2009/0089605 A1 * | 4/2009 | Westwick | ........... H03K 17/223 |
| | | | 713/340 |
| 2009/0273550 A1 | 11/2009 | Vieri et al. | |
| 2010/0102845 A1 * | 4/2010 | Kadow | ............. H03K 17/0822 |
| | | | 330/291 |
| 2018/0059166 A1 * | 3/2018 | Bodano | .................. G01R 31/27 |
| 2018/0102773 A1 | 4/2018 | Li et al. | |
| 2020/0200816 A1 | 6/2020 | Panakkal et al. | |
| 2021/0203309 A1 | 7/2021 | Wang et al. | |
| 2022/0381814 A1 | 12/2022 | Majima | |

* cited by examiner

MONITORING CIRCUIT AND CORRESPONDING METHOD

BACKGROUND

Technical Field

The description relates to monitoring circuits.

Description of the Related Art

Health monitoring of electronic components is the prognosis of potential failures of such components and consists in measuring the deviation of electrical parameters that can be correlated with the physical degradation of such components.

Health monitoring is of great importance as electronic components are widely used in most systems and their failures may lead to breakdowns and/or shutdowns of such systems, so preventing such failures may increase the robustness and reliability of systems.

Specifically, health monitoring is of relevance in the automotive field wherein preventing hazards may increase passenger safety.

In fact, ISO26262, which is the actual international standard considered for the functional safety of electrical and/or electronic systems that are installed in serial production road vehicles, defines a minimum requirement for safety which is measured using the Automotive Safety Integrity Level (ASIL) that is a safety level determined through hazard analysis and risk assessment.

Therefore, failures prediction and health monitoring of vehicle's electrical components may increase the ASIL safety level of a vehicle, allowing preemptive maintenance or replacement of electronic components considered at risk.

To satisfy ISO26262 requirements, safety critical environments such as automotive power distribution environments may use E-Fuses ("Electronic Fuses") with a high ASIL safety level. Such E-Fuses are integrated power path protection devices used to limit circuit currents and/or voltages to safe levels during fault conditions.

Usually, such E-Fuses may perform an inrush current control using a Power Metal Oxide Semiconductor Field Effect Transistor (MOSFET). In certain failure conditions, such Power MOSFET may be affected by short circuit failures, i.e., failures wherein the Power MOSFET cannot be controlled through its gate to be turned off, lowering the reliability of E-Fuses and, consequently, leading to a safety-critical situation.

Such short circuit failures in Power MOSFETs may be generated by physical degradations of the gate structure, such as:

a high leakage in the oxide of the gate, and/or a presence of charges trapped in the oxide of the gate.

In particular, this last condition may result in a reduction of the threshold voltage of a Power MOSFET, such threshold voltage corresponding to the voltage for switching the state of such Power MOSFET from a non-conductive state ("OFF") to a conductive state ("ON").

Such reduction may continue until the Power MOSFET, and consequently the corresponding device, i.e., the corresponding E-Fuse, remains normally in a conductive ON state, for instance, if the value of the threshold voltage of the Power MOSFET decreases to zero or to a negative value so that such Power MOSFET cannot be controlled through its gate to be turned off, i.e., to be switched to a non-conductive state.

For example, FIG. 1 illustrates an E-Fuse structure 10 showing the effects of the physical degradation of a Power MOSFET 100.

In FIG. 1 gate capacitance CDG, i.e., between a drain terminal D and a gate terminal G of the Power MOSFET 100, and Cos, i.e., between the gate terminal G and a source terminal S of the Power MOSFET 100, of the Power MOSFET 100 are represented as a drain-gate capacitor 106 of value equal to CDG and a gate-source capacitor 108 of value equal to $C_{GS}$ respectively.

A controller 102 is configured to send to a gate driver 104 an ON command $C_{ON}$ or an OFF command $C_{OFF}$, in order to set the state of the Power MOSFET 100 to an ON state, i.e., a conductive state, or to an OFF state, i.e., a non-conductive state, respectively.

The gate driver 104 is configured to vary the value of a gate-source voltage $V_{GS}$ between the gate terminal G and the source terminal S of the Power MOSFET 100 in response to the reception of a command from the controller 102.

In particular, in response to the ON command $C_{ON}$, the gate driver 104 is configured to set the value of the gate-source voltage $V_{GS}$ to a first value that is higher than a threshold voltage $V_{TH}$ of the Power MOSFET 100 in order to set the state of such Power MOSFET 100 to the conductive ON state.

Conversely, in response to the OFF command $C_{OFF}$, the gate driver 104 is configured to set the value of the gate-source voltage $V_{GS}$ to a second value that is lower than such threshold voltage $V_{TH}$ of the Power MOSFET 100, for instance, to zero, in order to set the state of the Power MOSFET 100 to the non-conductive OFF state.

A blocking diode 110 is a body drain diode of the Power MOSFET 100 that is intrinsic to the Power MOSFET structure itself.

In FIG. 1, the controller 102 is configured to send the OFF command $C_{OFF}$ to the gate driver 104 that, in response to the reception of such OFF command $C_{OFF}$, is configured to set the value of the gate-source voltage $V_{GS}$ to the second value, i.e., to a value lower than the threshold voltage $V_{TH}$ of the Power MOSFET 100, for instance, to zero.

In such a case, if the physical structure of the gate G of the Power MOSFET 100 is degraded, for instance, resulting in a relevant reduction of the value of the threshold voltage $V_{TH}$, for instance, if the current value of the threshold voltage $V_{TH}$ is a negative value, both the Power MOSFET 100 and the corresponding E-Fuse 10 remain in a conductive ON state even after the reception of an OFF command $C_{OFF}$, thus, a current $I_{DS}$ flows between the drain terminal D and the source terminal S of the Power MOSFET 100 even after the reception of such OFF command $C_{OFF}$.

Therefore, the E-Fuse 10 remains in a conductive ON state even if the controller 102 has sent a command for requesting a switch of such E-Fuse to a non-conductive OFF state, thus, generating a short circuit failure characterized by an uncontrolled conduction.

Such short circuit failures strongly compromise safety requirements imposed by ISO26262, since the Power MOSFET 100 and the corresponding device, i.e., the corresponding E-Fuse 10, cannot be controlled and switched off if required, i.e., such E-Fuse 10 with a corresponding Power MOSFET 100 failed in short circuit cannot limit currents and/or voltages to safe levels when required.

In fact, in an E-Fuse 10 with a corresponding Power MOSFET 100 failed in short circuit, the current $I_{DS}$ flowing between the drain terminal D and the source terminal S of the Power MOSFET 100 cannot be interrupted, and, consequently, a circuit to be protected coupled to the drain terminal D and/or to the source terminal S of such Power MOSFET 100 cannot be interrupted, i.e., its over-currents and/or over-voltages cannot be limited, thus, the protection fails.

In addition, the uncontrolled ON state of a Power MOS-FET 100 may generate high power dissipation, resulting in high temperatures, for instance, rising the temperature of an ECU ("Electronic Control Unit") wherein a corresponding E-Fuse 10 with a Power MOSFET 100 failed in short circuit is installed, leading to fire hazards.

Solutions that facilitate the health monitoring of such devices to prevent short circuit failures would be beneficial in order to have an early prognosis on the degradation of such devices and to prevent potential failures resulting in uncontrolled conduction.

BRIEF SUMMARY

One or more embodiments contribute in providing solutions that facilitate the health monitoring of MOSFETs, preventing short circuit failures in order to have an early prognosis on the degradation of both such MOSFETs and corresponding devices, for instance, E-Fuses, and to prevent potential failures resulting in uncontrolled conduction.

One or more embodiments concern a circuit having the features set forth below.

One or more embodiments concern a corresponding method.

Solutions as described herein include a circuit for monitoring an actual threshold voltage value of a Power MOS-FET comprising:

a current source, configured to be coupled to a source terminal of the Power MOSFET and to generate a test current, a voltage generator, configured to be coupled between a gate terminal of the Power MOSFET and the source terminal of the Power MOSFET, and to generate a test voltage, such test voltage being lower than a nominal threshold voltage value of the Power MOSFET, a detection unit, configured to sample a plurality of voltage value at the source terminal of the Power MOSFET during time to compute as a function of such plurality of voltage value at least a value of voltage variation over time, in particular over a given time period, of such voltage value at the source terminal of the Power MOSFET, and to provide such computed at least a value of voltage variation to an alarm generation unit, the alarm generation unit being configured to receive such computed voltage variation from the detection unit, to compare such computed voltage variation with a reference voltage, and to raise an alarm if the output of such comparison does not correspond to a predetermined output condition, and a control unit, configured to receive a test mode signal, indicative of an operation mode, wherein such control unit is further configured to, according to such received test mode signal, select the status of coupling or decoupling of such current source to/from the source terminal of the Power MOSFET, determine the value of such reference voltage, set such output condition of such comparison, and signal to the detection unit to perform a plurality of such sampling operation.

In various embodiments, if such test mode signal indicates a first test mode such control unit is configured to:

decouple such current source from the source terminal of the Power MOSFET, determine the value of such reference voltage so that such reference voltage is a positive voltage smaller than any possible value of such computed voltage variation obtained when the value of the actual threshold voltage is equal to or lower than the test voltage, and set as such predetermined output condition a result of the comparison between such computed voltage variation and such reference voltage indicating that such computed voltage variation is higher than such reference voltage.

while if such test mode signal indicates a second mode such control unit is further configured to:

couple such current source to the source terminal of the Power MOSFET, determine the value of such reference voltage so that such reference voltage is higher than any possible value of such computed voltage variation obtained when the value of the actual threshold voltage is equal to or lower than the test voltage and smaller than any possible value of such computed voltage variation obtained when the value of the actual threshold voltage is higher than the test voltage, and set as such predetermined output condition a result of the comparison between such computed voltage variation and such reference voltage indicating that such computed voltage variation is smaller than such reference voltage.

In various embodiments, such test mode signal is configured to indicate a first submode of such first test mode and a second submode of such first mode, wherein in the first submode mode such given time period is shorter than the period in the second mode.

In various embodiments, such circuit is coupled to an external load through the source terminal of the Power MOSFET, and the test mode signal selects an operation mode in a set of available operation modes, such set of available operation modes comprising at least:

such first mode, selected when the coupled external load is in an off state such first mode comprising such first submode corresponding to a resistive load and such second submode corresponding to a load comprising both a capacitive component and a resistive component, and such second mode, selected when the coupled external load is in an on state, in a standby mode, and the load corresponds to a capacitive load.

In various embodiments, such MOSFET is a Power MOSFET.

In various embodiments, such plurality of voltage value comprises a first voltage value and a second voltage value, such first voltage value being retrieved at the beginning of the given time period while such second voltage value being retrieved at the end of the given time period, and such compute operation to obtain the voltage variation as a function of such plurality of voltage value comprises subtracting such second voltage value from such first voltage value.

In various embodiments, such detection unit comprises:

a sensing unit, configured to sense voltage values at the source terminal of the Power MOSFET and to forward such sensed voltage values to a first sample and hold block and to a second sample and hold block, the first sample and hold block, configured to sample such first voltage value in response to the reception of a signal from the control unit indicating to perform a first of such sampling operation, to hold such first voltage value for an amount of time larger than such given time period, and to provide such first voltage value to a subtracting block, the second sample and hold block, configured to sample such second voltage value in response to the reception of a signal from the control unit indicating to perform a second of such sampling operation, to hold such second voltage value, and to provide such second voltage value to the subtracting block, the subtracting block, configured to receive the first voltage value from the first sample and hold block and the second voltage value from the second sample and hold block, to perform such subtracting of such second voltage value from such first voltage value obtaining such voltage variation, and to provide such voltage variation to the alarm generation unit.

In various embodiments, such alarm generation unit comprises:

a reference voltage generator, configured to provide a comparator block with such reference voltage, and the comparator block, configured to receive such computed voltage variation from the detection unit and such reference voltage from the reference voltage generator, to compare such computed voltage variation with such reference voltage, and to raise an alarm in response to an unsuccessful comparison operation.

In various embodiments, such circuit further comprises:

a first switch, configured to couple or decouple such current source to the source terminal of the Power MOSFET in response to the reception of a signal from the control unit issued as a function of such test mode signal.

In various embodiments, such circuit further comprises an additional switch configured to decouple a gate driver from the gate terminal of the Power MOSFET in response to the reception of a signal from the control unit indicating to start the monitoring of such actual threshold voltage value, and to couple the gate driver to the gate terminal of the Power MOSFET in response to the reception of a signal from the control unit indicating to end the monitoring of such actual threshold voltage value.

In various embodiments, such test voltage is fixed, or such test voltage is dynamic and such control unit is further configured to:

select an initial value for such test voltage, start the monitoring of such actual threshold voltage value, if the alarm generation unit do not raise any alarm before the end of the monitoring of such actual threshold voltage value, increase the value of such test voltage of a given step and perform again the steps from the starting of the monitoring, and if the alarm generation unit raises an alarm before the end of the monitoring of such actual threshold voltage value, identify the current value of the test voltage as the value of the actual threshold voltage value.

In various embodiments, such circuit is further coupled with a temperature monitoring unit or monitor, such temperature monitoring unit being configured to:

monitor a temperature of the Power MOSFET to sense at least one temperature value, and compute a value for such test voltage as a function of such at least one sensed temperature value, and provide such value for such test voltage to the circuit to generate a test voltage of such value through the voltage generator.

In various embodiments such circuit comprises a further switch, configured to couple or decouple such voltage generator to the gate terminal of the Power MOSFET in response to the reception of a signal from the control unit issued as a function of such test mode signal, and in such first and second mode such voltage generator is maintained coupled from the gate terminal of the Power MOSFET.

In various embodiments, such first and second mode such voltage generator is decoupled from the gate terminal of the Power MOSFET if a test enable signal mode is not set.

Solutions as described herein facilitate achieving the health monitoring of devices, for instance, E-Fuses, through the monitoring of corresponding MOSFETs so as to prevent short circuit failures in such MOSFETs. In this way, it may be possible to have an early prognosis on the degradation of both such MOSFETs and corresponding devices, i.e., E-Fuses, and to prevent potential failures resulting in uncontrolled conduction.

BRIEF DESCRIPTION OF THE SEVERAL VIEWS OF THE DRAWINGS

One or more embodiments will now be described, by way of example, with reference to the annexed figures, wherein.

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

DETAILED DESCRIPTION

In the ensuing description one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular configurations, structures, or characteristics may be combined in any adequate way in one or more embodiments.

The headings/references used herein are provided merely for convenience and hence do not define the extent of protection or the scope of the embodiments.

For simplicity and case of explanation, throughout this description, and unless the context indicates otherwise, like parts or elements are indicated in the various figures with like reference signs, and a corresponding description will not be repeated for each and every figure.

Figure 1:
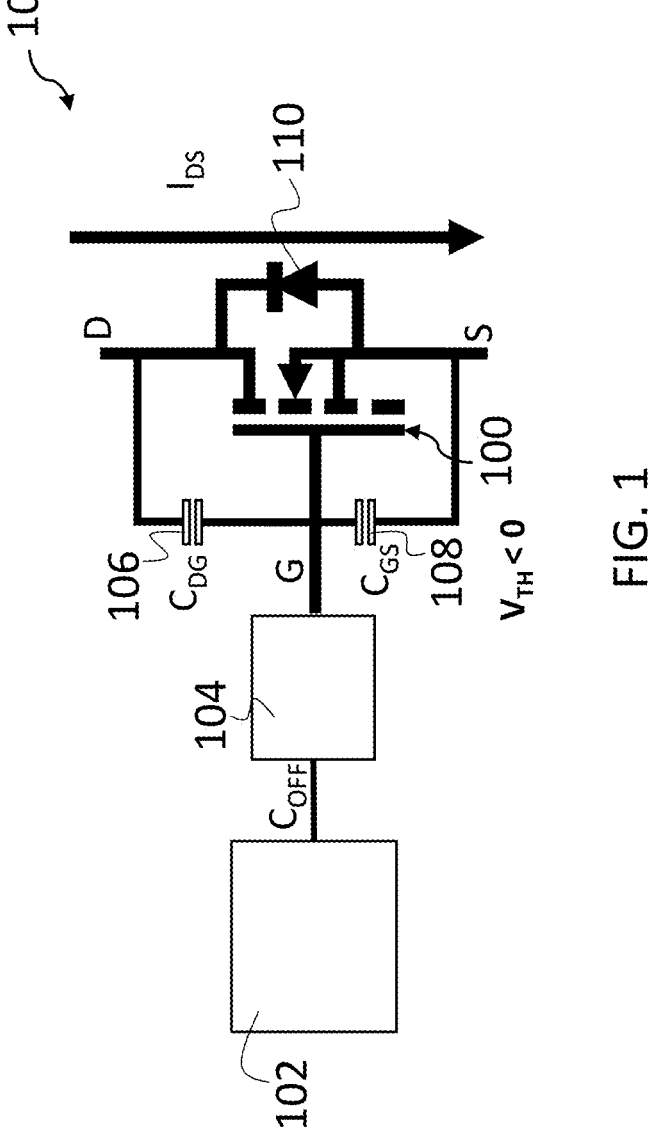
FIG. 1, as already described, illustrates an E-Fuse structure showing the effects of the physical degradation of a Power MOSFET.

In particular, in the following figures, parts, elements and/or components which have already been described with reference to FIG. 1 are denoted by the same references previously used in such figure, therefore, the description of such previously described elements will not be repeated in the following in order not to overburden the present detailed description.

As previously described, it would be beneficial to find solutions that facilitate the health monitoring of MOSFETs, preventing short circuit failures in order to have an early prognosis on the degradation of both such MOSFETs and corresponding devices, i.e., E-Fuses, and to prevent potential failures resulting in uncontrolled conduction.

According to embodiments of the present disclosure, a diagnostic as explained above, i.e., the health monitoring of MOSFETs and corresponding devices, may be done by monitoring the value of a threshold voltage $V_{TH}$ of a Power MOSFET 100 while such Power MOSFET 100 is coupled to a given circuit to be protected, i.e., while it is coupled to a given load.

It is noted that even if the following description is mainly focused on solutions using a Power MOSFET, for instance, an N-channel Power MOSFET or a P-channel Power MISFET, solutions as described herein may also be implemented considering GaN transistors or SiC Power MOSFET.

It is to be noted that even if the following description is mainly focused on the application of proposed solutions in the automotive sector, solutions as described herein may be used also in other application contexts wherein it is desired to measure and/or monitor a threshold voltage of a Power MOSFET with a coupled load, for instance, a resistive and/or capacitive load.

In many application contexts, standard threshold voltage $V_{TH}$ measurements cannot be used, for instance, as an E-Fuse 10, i.e., a corresponding MOSFET, may be always coupled to a resistive and/or capacitive load, i.e., to a circuit to be protected. In addition, such an E-Fuse 10 may be configured to have the corresponding Power MOSFET 100 set by default to a conductive ON state (such Power MOSFET 100 may switch to a non-conductive OFF state in case of over-currents and/or over-voltages detected in such circuit to be protected), so, in most cases, threshold voltage $V_{TH}$ measurements should be performed during the conductive ON state of such Power MOSFET 100.

Figure 2:
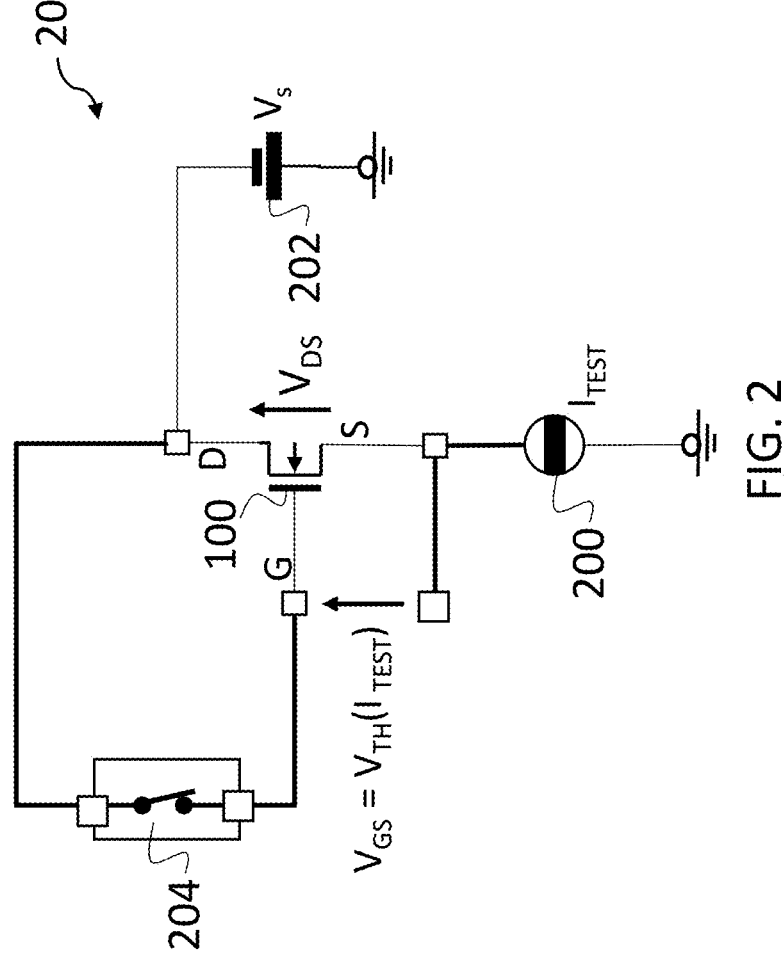
FIG. 2 illustrates a solution for measuring the value of the threshold voltage in a Power MOSFET.

FIG. 2 illustrates a solution 20 for measuring the value of a threshold voltage $V_{TH}$ in a Power MOSFET 100.

The Power MOSFET 100 of FIG. 2 is configured to:

have coupled to its drain terminal D a voltage supply 202, configured to supply the Power MOSFET 100 with a voltage of value $V_S$, and a switch 204 configured to be in a closed state;

have coupled to its gate terminal G the closed switch 204, therefore, both the drain terminal D and the gate terminal G are set to the same voltage level; and have coupled to its source terminal S a current source 200, for instance, a current generator, configured to generate a test current of value $I_{TEST}$, for instance, whose value is the minimum value allowing to switch the state of the Power MOSFET 100 from a non-conductive OFF state to a conductive ON state, i.e., the minimum value allowing to set the gate-source voltage $V_{GS}$, i.e., the voltage between the gate terminal G and the source terminal S of the Power MOSFET 100, to the value of the current threshold voltage $V_{TH}$ of the Power MOSFET 100.

As illustrated in FIG. 2, with such a structure 20 the drain-source voltage $V_{DS}$, i.e., the voltage between the drain terminal D and the source terminal S, is equal to the gate-source voltage $V_{GS}$, i.e., the voltage between the gate terminal G and the source terminal S, as both the drain terminal D and the gate terminal G are at the same voltage level $V_S$.

Therefore, in the conditions of FIG. 2, the drain-source voltage $V_{DS}$ is equal to the gate-source voltage $V_{GS}$, and both of these voltages are equal to the value of the threshold voltage $V_{TH}$ of the Power MOSFET 100.

Hence, the value of the threshold voltage $V_{TH}$ of the Power MOSFET 100 may be evaluated as a function of the value of the test current $I_{TEST}$ generated by the current source 200.

Nevertheless, such a solution 20 cannot be used when a load is coupled to the source terminal S of the Power MOSFET 100.

Figure 3:
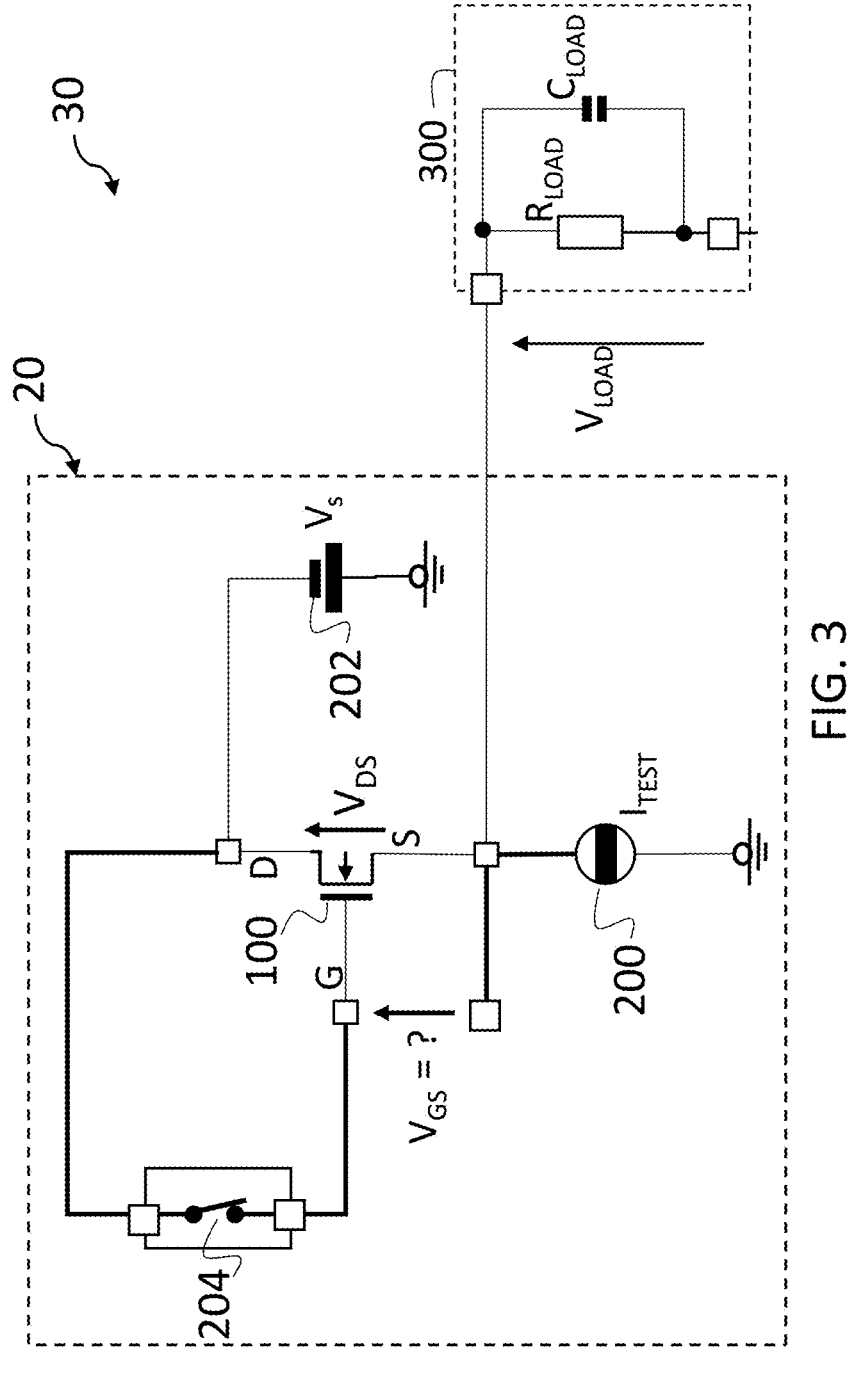
FIG. 3 illustrates the solution of FIG. 2 for measuring the value of the threshold voltage in a Power MOSFET which is coupled to an external device.

To this regard, FIG. 3 illustrates the solution 20 of FIG. 2 for measuring the value of the threshold voltage $V_{TH}$ in a Power MOSFET 100 as coupled to an external device 300, i.e., represented by any capacitive load $C_{LOAD}$, e.g., a load capacitor, and/or resistive load $R_{LOAD}$, e.g., a load resistor.

It is noted that, although FIG. 3 shows a load 300 comprising a resistive load $R_{LOAD}$ and capacitive load $C_{LOAD}$, such load 300 may present only a substantial resistive behavior, i.e., may correspond to or may be modeled with only the resistive load component $R_{LOAD}$, only capacitive, i.e., may correspond to or be modeled with only the capacitive load component $C_{LOAD}$, or both resistive component $R_{LOAD}$ and capacitive component $C_{LOAD}$.

As exemplified in FIG. 3, when a load 300, for instance, an ECU, is coupled to the source terminal S of the Power MOSFET 100, the value of the test current $I_{TEST}$ generated by the current source 200 cannot be defined and set to a chosen value as its value is influenced by the given load 300, i.e., by the voltage of the source terminal S that is determined by the voltage $V_{LOAD}$ on the load 300, which may also be a variable voltage.

For example, this may be the case of an automotive environment wherein the load 300 may represent an ECU, i.e., an Electronic Control Unit, that may be modeled as a both resistive load $R_{LOAD}$ and capacitive (i.e., wherein the capacitor may be a bulk capacitor with a value of about 1 mF) $C_{LOAD}$ load.

Considering the structure illustrated in FIG. 3, it is noted that the threshold voltage $V_{TH}$ may be measured if the load 300 comprises, for example, only a capacitive component $C_{LOAD}$, for instance, if the load 300 is an ECU in a standby mode Sb modeled as a capacitor $C_{LOAD}$. In such a case, a measurement of the value of the threshold voltage $V_{TH}$ may be done by closing the switch 204 and waiting for a charging time $CT_{CLOAD}$, i.e., until the capacitor $C_{LOAD}$ is charged by the selected test current $I_{TEST}$.

A drawback is that the capacitive component $C_{LOAD}$ delays for a charging time $C_{CLOAD}$, i.e., for a time equal to $$TC_{CLOAD} = C_{LOAD} * \frac{V_{TH}}{I_{TEST}},$$

the measurement of the threshold voltage $V_{TH}$ since the test current $I_{TEST}$, for instance, a current of 1 mA, has to flow in the capacitive component $C_{LOAD}$ until the drain-source voltage $V_{DS}$ remains stable to the threshold voltage $V_{TH}$ value.

For instance, if the capacitive load $C_{LOAD}$ is about 1 mF, the test current $I_{TEST}$ is about 1 mA, and the threshold voltage $V_{TH}$ is about 1.5 V, the charging time $CT_{CLOAD}$ is about 1.5 s, which is not negligible.

Figure 4:
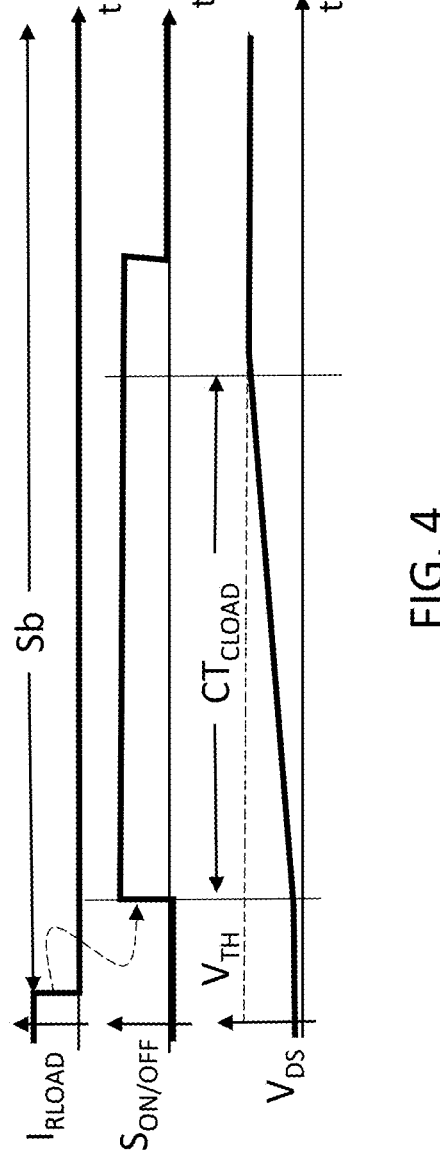
FIG. 4 is a time diagram illustrating the behavior of signals in the solution of FIG. 3.

FIG. 4 is a time diagram illustrating the behavior of signals in the solution 30 of FIG. 3.

A current signal $I_{RLOAD}$ indicates the current flowing within the resistive component $R_{LOAD}$ of the load 300.

When the current signal $I_{RLOAD}$ value is zero, for instance, when a corresponding ECU enters in a standby mode Sb, the only remaining component of the load 300 is the capacitive component $C_{LOAD}$, therefore, the threshold voltage $V_{TH}$ may be measured.

In response to the value of the current signal $I_{RLOAD}$ reaching zero, a switch control signal $S_{ON/OFF}$ commutes, for instance, from a low logic level to a high logic level, in order to command the closure of the switch 204, and, in response to the closure of such switch 204, the test current $I_{TEST}$ starts flowing in the capacitive component $C_{LOAD}$ of the load 300, charging such capacitive component $C_{LOAD}$ until the voltage $V_{DS}$ remains substantially stable to the threshold voltage $V_{TH}$ value, i.e., after the charging time $TC_{CLOAD}$.

Solutions that simplify and increase the precision of the monitoring of threshold voltages $V_{TH}$ in transistors, allowing such monitoring even when loads are coupled therewith, would be beneficial in order to have an early prognosis of degradation of devices and to prevent potential failure resulting in uncontrolled conduction.

Figure 5:
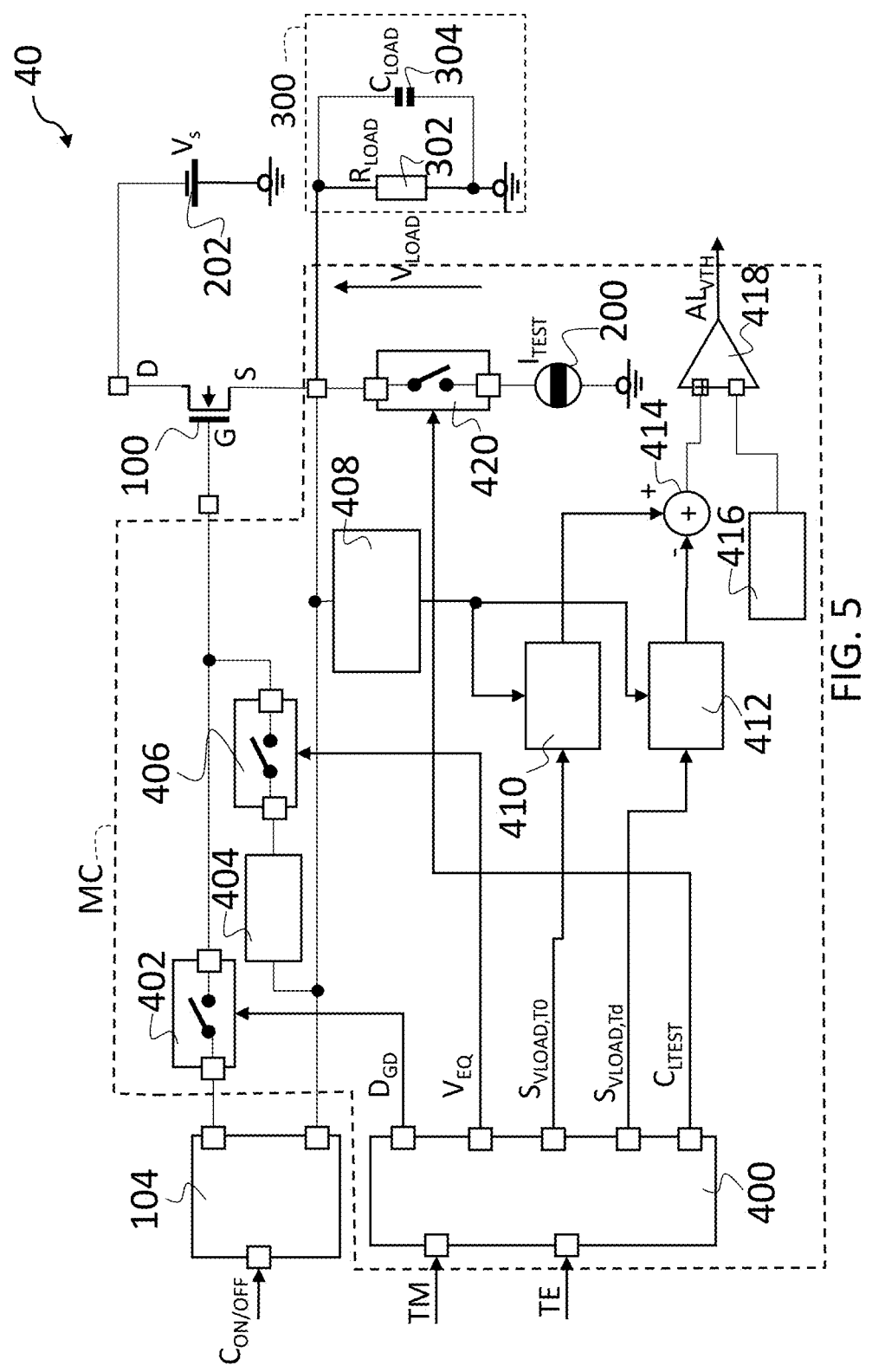
FIG. 5 is a block diagram of a monitoring circuit for measuring the value of the threshold voltage in a Power MOSFET which is coupled to an external device according to embodiments of the present description.

FIG. 5 is a block diagram 40 of a monitoring circuit MC for measuring the value of a threshold voltage $V_{TH}$ in a Power MOSFET 100 which is coupled to an external device 300, i.e., a load 300, according to embodiments of the present description.

It is noted that such monitoring circuit MC may be embedded, for instance, in a power actuator, in an electric fuse, or similar.

The Power MOSFET 100 of FIG. 3 is configured to:

have coupled to its drain terminal D a voltage supply 202, configured to supply the Power MOSFET 100 with a voltage of value $V_S$;

have coupled to its gate terminal G a first switch 402, configured to couple such MOSFET 100 to a first output terminal of a gate driver 104, and a second switch 406, configured to couple such MOSFET 100 to a voltage generator 404; and have coupled to its source terminal S a second output terminal of such gate driver 104, a third switch 420, configured to couple such MOSFET 100 to a current source 200, and an external load 300, that may be of the same types as already described in FIG. 3.

The gate driver 104 is configured to vary the value of a gate-source voltage $V_{GS}$, i.e., the voltage between the gate terminal G and the source terminal S, of the Power MOSFET 100 in response to the reception of a command $C_{ON/OFF}$ from the controller 102 (previously described and not shown in FIG. 5).

To this purpose, the gate driver 104 has a first output terminal that is configured to be coupled to the gate terminal G of the Power MOSFET 100, for instance, through the first switch 402, and a second output terminal that is configured to be coupled to the source terminal S of the Power MOSFET 100.

Therefore, in response to the ON command $C_{ON}$, the gate driver 104 is configured to set the value of the gate-source voltage $V_{GS}$ to a first value that is higher than the value of the threshold voltage $V_{TH}$ of the Power MOSFET 100 in order to set the state of such Power MOSFET 100 to the conductive ON state.

Conversely, in response to the OFF command $C_{OFF}$, the gate driver 104 is configured to set the value of the gate-source voltage $V_{GS}$ to a second value that is lower than the value of the threshold voltage $V_{TH}$, for instance, to zero, in order to set the state of the Power MOSFET 100 to the non-conductive OFF state.

The first switch 402 is configured to couple the first output terminal of the gate driver 104 to the gate terminal G of the Power MOSFET 100, such coupling being enabled in response to the reception of a disconnect gate driver signal $D_{GD}$ from a timing block 400, for instance, a microcontroller, a control logic, or other types of processing units, indicating to couple the gate driver 104 to the Power MOSFET 100.

In fact, the first switch 402 is further configured to receive a disconnect gate driver signal $D_{GD}$ from the timing block 400 and to change its state, i.e., to open or close, in response to such disconnect gate driver signal $D_{GD}$.

Therefore, if the disconnect gate driver signal $D_{GD}$ indicates to couple the gate driver 104 to the Power MOSFET 100, such first switch 402 is configured to close.

Conversely, the first switch 402 is configured to remain open in response to the disconnect gate driver signal $D_{GD}$ indicating to decouple the gate driver 104 from the Power MOSFET 100.

The current source 200, for instance, a current generator, is configured to be coupled to the source terminal S of the Power MOSFET 100, for instance, through the third switch 420, and to generate a test current $I_{TEST}$ flowing through the load 300 and/or the source terminal S of the Power MOSFET 100.

The third switch 420 is configured to couple such current source 200 to the source terminal S of the Power MOSFET 100 and to the load 300, such coupling being enabled in response to the reception of a connect load test signal $C_{LTEST}$ from the timing block 400 indicating to couple the current source 200 to such MOSFET 100 and such load 300.

In fact, the third switch 420 is further configured to receive a connect load test signal $C_{LTEST}$ from the timing block 400 and to change its state, i.e., to open or close, in response to such connect load test signal $C_{LTEST}$.

Therefore, if the connect load test signal $C_{LTEST}$ indicates to couple the current source 200 to the Power MOSFET 100 and to the load 300, such third switch 420 is configured to close.

Conversely, the third switch 420 is configured to remain open in response to the connect load test signal $C_{LTEST}$ indicating to decouple the current source 200 from the Power MOSFET 100 and the load 300.

The voltage generator 404 is configured to supply a test voltage of value $V_{TEST}$ between the gate terminal G and the source terminal S of the Power MOSFET 100, thus, controlling the gate-source voltage $V_{GS}$ value.

To this purpose, such voltage generator 404 is configured to be coupled to the second output terminal of the gate driver 104, i.e., to the source terminal S of the Power MOSFET 100, and to the gate terminal G of the Power MOSFET 100, for instance, through the second switch 406.

Such test voltage of value $V_{TEST}$ supplied by the voltage generator 404 is a voltage that diverges from a nominal value of the threshold voltage $NV_{TH}$ of a chosen amount $V_{GAP}$, that can be set according to the application considered and to the safety level that is to be respected.

Therefore, being the value of the test voltage $V_{TEST}$ smaller than the nominal threshold voltage $NV_{TH}$ of a given amount $V_{GAP}$, when such test voltage $V_{TEST}$ is applied between the gate terminal G and the source terminal S of the Power MOSFET 100 the corresponding MOSFET 100 is expected to remain in a non-conductive OFF state.

It is noted that if the actual threshold voltage $AV_{TH}$ is shifted from the nominal one $NV_{TH}$, for instance, because of physical degradations of the gate structure, of an amount equal to or higher than the chosen value $V_{GAP}$, i.e., so that the actual threshold voltage $AV_{TH}$ is equal to or lower than the voltage $V_{TEST}$, it may be possible that in response to the application of the test voltage $V_{TEST}$ between the gate terminal G and the source terminal S of the Power MOSFET 100, such MOSFET 100 may shift to a conductive ON state, i.e., a current $I_{DS}$ starts flowing between the drain terminal D and the source terminal S of the Power MOSFET 100.

In response to the current $I_{DS}$ starting flowing between the drain terminal D and the source terminal S of the Power MOSFET 100, a variation of the voltage $V_{LOAD}$ on the load 300 may be observed.

Therefore, the load 300 may be used as a current sensor to check if a current $I_{DS}$ is flowing between the drain terminal D and the source terminal S of the Power MOSFET 100, independently from the circuitry of the load itself and/or from the circuitry of a power actuator wherein embodiments of the proposed solutions may be embedded.

It may be noted that, generally, the Power MOSFET 100 may contain a current mirror referred to as FET, therefore, such current mirror may be used as the current sensor itself.

Nevertheless, using such current mirror as current sensor may not be reliable since a drift in the threshold voltage $V_{TH}$ may change the current ratio between a current $I_{DS}$ flowing between the drain terminal D and the source terminal S of the Power MOSFET 100 and a current flowing in such current mirror, making a sensed current obtained using such current mirror internal to such MOSFET 100 unreliable.

In various embodiments, the test voltage $V_{TEST}$ and, as a consequence, the chosen value $V_{GAP}$, may be fixed. In such cases, the monitoring circuit MC of FIG. 5 is configured to raise an alarm if the actual threshold voltage $AV_{TH}$ reaches the test voltage $V_{TEST}$ (i.e., is equal to or lower than the voltage $V_{TEST}$). Such a condition may be identified by detecting an unexpected variation of the voltage $V_{LOAD}$ on the load 300 in response to the test voltage $V_{TEST}$ being applied to the Power MOSFET 100 and causing a switch of such MOSFET 100 from a non-conductive OFF state to a conductive ON state, i.e., generating a current $I_{DS}$ that flows between the drain terminal D and the source terminal S.

In various embodiments, the test voltage $V_{TEST}$ and, as a consequence, the chosen value $V_{GAP}$, may be dynamic. In such cases, the following operations are performed by the monitoring circuit MC of FIG. 5:

set. the test voltage $V_{TEST}$ and the value $V_{GAP}$ to initial values;

test the state of the Power MOSFET 100, i.e., conductive ON state or non-conductive OFF state, for instance, by using the load 300 as current sensor;

if the Power MOSFET 100 is in a non-conductive OFF state, for example, if a current flowing in the load 300 is not detected, increase of a given step the value of the test voltage $V_{TEST}$ and decrease of the same given step the value $V_{GAP}$, and return again to the testing step; and if the Power MOSFET 100 is in a conductive ON state, for instance, if a current flowing in the load 300 is detected with a corresponding variation of the voltage $V_{LOAD}$ on the load 300, the value of the test voltage $V_{TEST}$ corresponds to the actual threshold voltage $AV_{TH}$.

Therefore, in embodiments with a dynamic test voltage $V_{TEST}$ the actual threshold voltage $AV_{TH}$ may be measured since such actual threshold voltage $AV_{TH}$ corresponds to the chosen voltage $V_{TEST}$.

It is noted that such measurement of the actual threshold voltage $AV_{TH}$ may be retrieved if the current flowing in the load 300 is compatible with a measurable currents range of the load 300, wherein such measurable currents range depends on a minimum measurable voltage and on the value of the resistive component $R_{LOAD}$ of the load 300.

The second switch 406 is configured to couple such voltage generator 404 to the gate terminal G of the Power MOSFET 100, such coupling being enabled in response to the reception of a voltage equality signal $V_{EQ}$ from the timing block 400 indicating to couple the voltage generator 404 to the Power MOSFET 100, in order to set the value of the gate-source voltage Vas to a value substantially equal (i.e., considering a given tolerance range) to the voltage $V_{TEST}$.

In fact, the second switch 406 is further configured to receive a voltage equality signal $V_{EQ}$ from the timing block 400 and to change its state, i.e., to open or close, in response to such voltage equality signal $V_{EQ}$.

Therefore, if the voltage equality signal $V_{EQ}$ indicates to couple the voltage generator 404 to the Power MOSFET 100, such second switch 406 is configured to close.

Conversely, the second switch 406 is configured to remain open in response to the voltage equality signal $V_{EQ}$ indicating to decouple the voltage generator 404 from the Power MOSFET 100.

The timing block 400 is configured to receive at least a test enable signal TE, indicating if a test of the value of the threshold voltage $V_{TH}$ of the Power MOSFET 100 is to be performed using the monitoring circuit MC of FIG. 5, and a test mode signal TM, indicating which test mode in a plurality of test mode is to be used for a current test of the value of the threshold voltage $V_{TH}$ of the Power MOSFET 100 using such monitoring circuit MC of FIG. 5.

For instance, the plurality of test mode may include at least:

- a first mode wherein the coupled external device is considered in an OFF state; and
- a second mode wherein the coupled external device is considered in an ON state, in a standby mode, and the load 300 may correspond to or may be modeled as a pure capacitive load $C_{LOAD}$.

Such first mode may further comprise at least:

- a first submode wherein the coupled external device corresponds to or may be modeled as a resistive load $R_{LOAD}$; and
- a second submode wherein the coupled external device corresponds to or may be modeled as a load 300 comprising both a capacitive component $C_{LOAD}$ and a resistive component $R_{LOAD}$.

As a function of such test enable signal TE and such test mode signal TM, the timing block 400 is further configured to generate a plurality of control signals, such plurality of control signals comprising at least the following signals:

- the disconnect gate driver signal $D_{GD}$, indicating to the first switch 402 whether the gate driver 104 is to be coupled to or decoupled from the gate terminal G of the Power MOSFET 100;
- the voltage equality signal $V_{EQ}$, indicating to the second switch 406 whether the voltage generator 404 is to be coupled to or decoupled from the gate terminal G of the Power MOSFET 100;
- the connect load test signal $C_{LTEST}$, indicating to the third switch 420 whether the current source 200 is to be coupled to or decoupled from the source terminal S of the Power MOSFET 100;
- a first load voltage sampling signal $S_{VLOAD,T0}$, indicating to a first sample and hold ("S&H") block 410 whether to sample or not a received signal; and
- a second load voltage sampling signal $S_{VLOAD,Td}$, indicating to a second sample and hold ("S&H") block 412 whether to sample or not a received signal.

A sensing block 408 is configured to have a sensing terminal coupled to the source terminal S of the Power MOSFET 100 and to the load 300, and an output terminal coupled to the first sample and hold block 410 and to the second sample and hold block 412.

Such sensing block 408 is further configured to:

- sense, through its sensing terminal, the value of the voltage at the source terminal S of the Power MOSFET 100 and the load 300, i.e., the value of the voltage $V_{LOAD}$, in order to monitor its variations, and
- forward, through its output terminal, a sensed value of the voltage $V_{LOAD}$ to the first sample and hold block 410 and to the second sample and hold block 412.

The first sample and hold block 410 is configured to receive the sensed value of the voltage $V_{LOAD}$ from the sensing block 408 and the first load voltage sampling signal $S_{VLOAD,T0}$ from the timing block 400, and, in response to the reception of such first load voltage sampling signal $S_{VLOAD,T0}$ indicating to sample the received signal, is further configured to sample the received sensed value of the voltage $V_{LOAD}$ and to hold its value for a given time, for instance, a time longer than a selected time period $T_d$, while providing it to a subtracting block 414.

Similarly, the second sample and hold block 412 is configured to receive the sensed value of the voltage $V_{LOAD}$ from the sensing block 408 and the second load voltage sampling signal $S_{VLOAD,Td}$ from the timing block 400, and, in response to the reception of such second load voltage sampling signal $S_{VLOAD,Td}$ indicating to sample the received signal, is further configured to sample the received sensed value of the voltage $V_{LOAD}$ and to hold its value for a given time, for instance, a time longer or shorter than the selected time period $T_d$, while providing it to the subtracting block 414.

The subtracting block 414 is configured to receive sensed value of the voltage $V_{LOAD}$ from both the first sample and hold block 410 and the second sample and hold block 412, to subtract the sensed value received from the second sample and hold block 412 from the sensed value received from the first sample and hold block 410, and to provide the result of such subtraction to a first input terminal of a comparator 418.

In various embodiments, the functions that are performed by the sensing block 408, the first sample and hold block 410, the second sample and hold block 412, and the subtracting block 414 may be performed by a detection unit or detector 408-414 that is configured to:

- sense the voltage value $V_{LOAD}$ at the source terminal S of the Power MOSFET 100 and, as a consequence, on the load 300,
- compute a voltage variation indicative of changings in such sensed voltage value $V_{LOAD}$ over a given time period $T_d$, for instance, by subtracting a second voltage value sensed at a second time instant from a first voltage value sensed at a first time instant, i.e., before the second time instant, and
- provide said voltage variation indicative of changings in such sensed voltage value $V_{LOAD}$ over the given time period $T_d$ to the comparator 418 or to an alarm generation unit 416-418.

In fact, such functions that are performed by the sensing block 408, the first sample and hold block 410, the second sample and hold block 412, and the subtracting block 414 may be performed by different real implementations, for instance, such functions may be implemented without using a first and a second sample and hold blocks 410-412.

In such a case, the reference voltage generator 416 and the comparator 418 may be coupled to a ground terminal GND for the first test mode and to the voltage of value $V_S$ for the second test mode. Then the voltage variation may be obtained by monitoring the output of the comparator 418, for instance, after a delay $T_d$.

A reference voltage generator 416 is configured to supply a second input terminal of the comparator 418 with a reference voltage of value $V_{REF}$.

In various embodiments, such reference voltage value $V_{REF}$ generated by the reference voltage generator 416 may be determined according to the current test mode considered, i.e., according to the current value of the test mode signal TM.

The comparator 418, for instance, implemented through an operational amplifier, is configured to receive at its first input terminal the result of the subtraction from the subtracting block 414 or the voltage variation provided by the detection unit 408-414 and at its second input terminal the reference voltage $V_{REF}$ from the reference voltage generator 416.

Such comparator 418 is further configured to compare the voltage values received at its first and second input terminals, and, if the result of such comparison is unsuccessful, the comparator 418 is configured to raise an alarm signal $AL_{VTH}$, indicating that the corresponding circuit may be at risk of short circuit failures.

In particular, the result of such comparison may be considered as unsuccessful if the output of the comparison does not correspond to a predetermined output condition, such predetermined output condition may depend on the current test mode considered, for instance:

if the first or the second test modes previously described are used, the result of the comparison is considered unsuccessful if the result of the subtraction received from the subtracting block 414 at the first input terminal is higher than the reference voltage $V_{REF}$ received at the second input terminal, therefore, generally, the result of the comparison is considered unsuccessful if the voltage variation, for instance, received by the comparator 418, is higher than the reference voltage $V_{REF}$; and if the third mode previously described is used, the result of the comparison is considered unsuccessful if the result of the subtraction received from the subtracting block 414 at the first input terminal is lower than the reference voltage $V_{REF}$ received at the second input terminal, therefore, generally, the result of the comparison is considered unsuccessful if the voltage variation, for instance, received by the comparator 418, is lower than the reference voltage $V_{REF}$.

In various embodiments, the reference voltage generator 416 and the comparator 418 may be comprised in the alarm generation unit or alarm generator 416-418 that is configured to:

receive the voltage variation indicative of changings in such sensed voltage value $V_{LOAD}$ over a given time period $T_d$, for instance, the result of the subtraction from the subtracting block 414 or the output of the detection unit 408-414, compare such received voltage variation with a reference value $V_{REF}$ which may be both internally generated according to the current test mode considered, for instance, using the voltage generator 416, or received from an external unit, and generate an alarm, for instance, by setting the alarm signal $AL_{VTH}$ to a high logic level in response to an unsuccessful comparison operation (i.e., wherein a comparison operation is considered unsuccessful according to the criteria previously described).

To summarize, the circuit MC for monitoring an actual threshold voltage value $AV_{TH}$ of a MOSFET 100, i.e., the current value of the threshold voltage $V_{TH}$ of the MOSFET 100, comprises:

a current source 200, configured to be coupled to a source terminal S of the MOSFET 100 and to generate a test current $I_{TEST}$, a voltage generator 404, configured to be coupled between a gate terminal G of the MOSFET 100 and the source terminal S of the MOSFET 100, and to generate a test voltage $V_{TEST}$, said test voltage $V_{TEST}$ being lower than a nominal threshold voltage value $NV_{TH}$ of the MOSFET 100, i.e., the value of the threshold voltage $V_{TH}$ of the MOSFET 100 without any modification due to external effects, a detection unit 408-414, configured to sample a plurality of voltage value $V_{LOAD}$ at the source terminal S of the MOSFET 100, i.e., to sample values of the voltage on a coupled load 300, during time, for instance, during the time period $T_d$, to compute as a function of said plurality of voltage value $V_{LOAD}$ at least a value of voltage variation over time, for instance, a voltage variation, in particular over a given time period $T_d$, of said voltage value $V_{LOAD}$ at the source terminal S of the MOSFET 100, and to provide said computed at least a value of voltage variation to an alarm generation unit 416-418, the alarm generation unit 416-418 being configured to receive said computed voltage variation from the detection unit 408-414, to compare said computed voltage variation with a reference voltage $V_{REF}$, and to raise an alarm $AL_{VTH}$ if the output of said comparison does not correspond to a predetermined output condition, for instance, if the if the result of such comparison is unsuccessful, and a control unit or controller 400, i.e., the timing block 400, configured to receive a test mode signal TM, indicative of an operation mode, i.e., depending on the load that is currently coupled with such monitoring circuit MC, wherein said control unit 400 is further configured to, according to said received test mode signal TM, select the status of coupling or decoupling of said current source 200 to/from the source terminal S of the MOS-FET 100, determine the value of said reference voltage $V_{REF}$, set said output condition of said comparison, i.e., according to the coupled load determine the corresponding condition for a result of such comparison to be unsuccessful, and signal to the detection unit 408-414 to perform a plurality of said sampling operation, for instance, indicating to the first sample and hold block 410 and to the second sample and hold block 412 to sample the voltage on the load $V_{LOAD}$ received from the sensing block 408.

Figure 6:
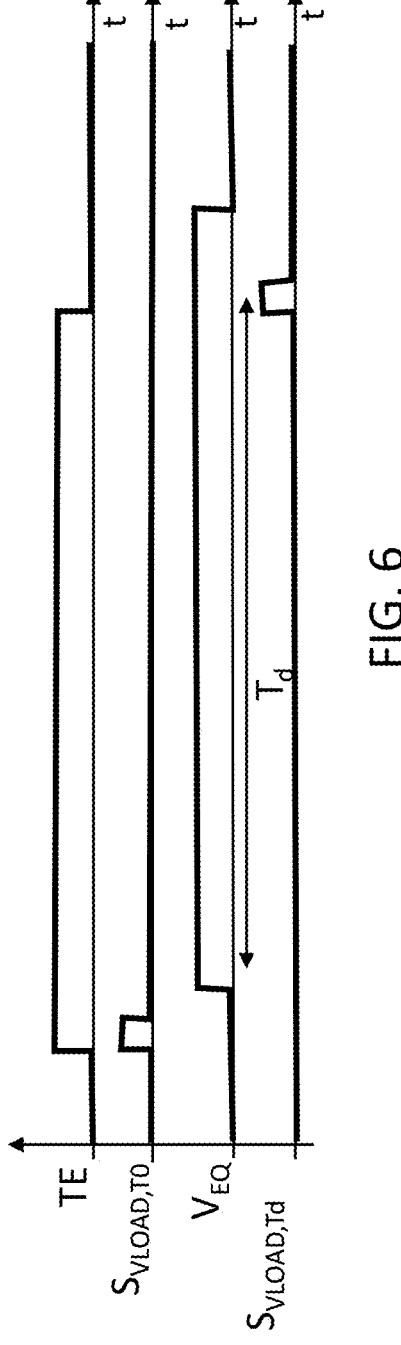
FIG. 6 is a time diagram illustrating the behavior of signals in the circuit of FIG. 5 according to embodiments of the present description.

FIG. 6 is a time diagram illustrating the behavior of signals in the monitoring circuit MC of FIG. 5 according to embodiments of the present description.

In particular, FIG. 6 illustrates the behavior of signals received by or generated from the timing block 400.

In response to the reception of the test enable signal TE indicating, for instance, by switching from a low logic level to a high logic level, to perform a test of the value of the threshold voltage $V_{TH}$ of the Power MOSFET 100 using the monitoring circuit MC of FIG. 5, the timing block 400 is configured to indicate, for instance, by sending a pulse on the first load voltage sampling signal $S_{VLOAD,T0}$ or by switching it to a high logic level, to the first sample and hold block 410 to sample the sensed value of the voltage $V_{LOAD}$ before any changes in the operation of the circuit.

In response to the first sample and hold block 410 sampling the sensed value of the voltage $V_{LOAD}$, the timing block 400 is configured to modify the operation of the monitoring circuit MC of FIG. 5 indicating, for instance, by setting the voltage equality signal $V_{EQ}$ to a high logic level, to couple the voltage generator 404 to the gate terminal G of the Power MOSFET 100, setting the value of the gate-source voltage $V_{GS}$ to a value substantially equal to the voltage $V_{TEST}$.

Then, after a given time equal to $T_d$, the timing block 400 is further configured to indicate, for instance, by sending a pulse on the second load voltage sampling signal $S_{VLOAD,Td}$ or by switching it to a high logic level, to the second sample and hold block 412 to sample the sensed value of the voltage $V_{LOAD}$ that may have been changed after the setting of the gate-source voltage Vas to the voltage $V_{TEST}$, thus, the voltage $V_{LOAD}$ is sampled after changes in the operation of the circuit.

In this way, the subtracting block 414 may subtract the sensed voltage $V_{LOAD}$ received from the second sample and hold block 412, i.e., the sensed voltage $V_{LOAD}$ after the setting of the gate-source voltage Vas to the voltage $V_{TEST}$, from the sensed voltage $V_{LOAD}$ received from the first sample and hold block 410, i.e., before any changes in the operation of the circuit.

The available test modes in the plurality of test modes are chosen in order to avoid interferences with the operations of a coupled load 300, for instance, an ECU.

To this purpose, the monitoring circuit MC may advantageously be activated, for instance, by setting the test enable signal TE to a high logic level, in specific working conditions, for instance, when the coupled load 300 is in an OFF state or in a standby mode, in particular:

when the coupled load 300 is in an OFF state and may be modeled with a resistive load $R_{LOAD}$;

when the coupled load 300 is in an OFF state and may be modeled with a load 300 comprising both a resistive component $R_{LOAD}$ and a capacitive component $C_{LOAD}$; and when the coupled load 300 is in an ON state, in a standby mode, and may be modeled with a capacitive $C_{LOAD}$ load.

Therefore, in various embodiments, the monitoring circuit MC may be activated when the coupled load 300 is in an OFF state, i.e., there is no current flowing within such load 300, for instance, a case when a power actuator directly activates a load that is resistive and/or capacitive.

In such cases, when the coupled load 300 is in an OFF state, the voltage $V_{LOAD}$ on the load 300 is a very low voltage, for instance, a voltage close to zero, thus, the corresponding gate-source voltage $V_{GS}$ of the Power MOSFET 100 is substantially equal to zero.

Figure 7:
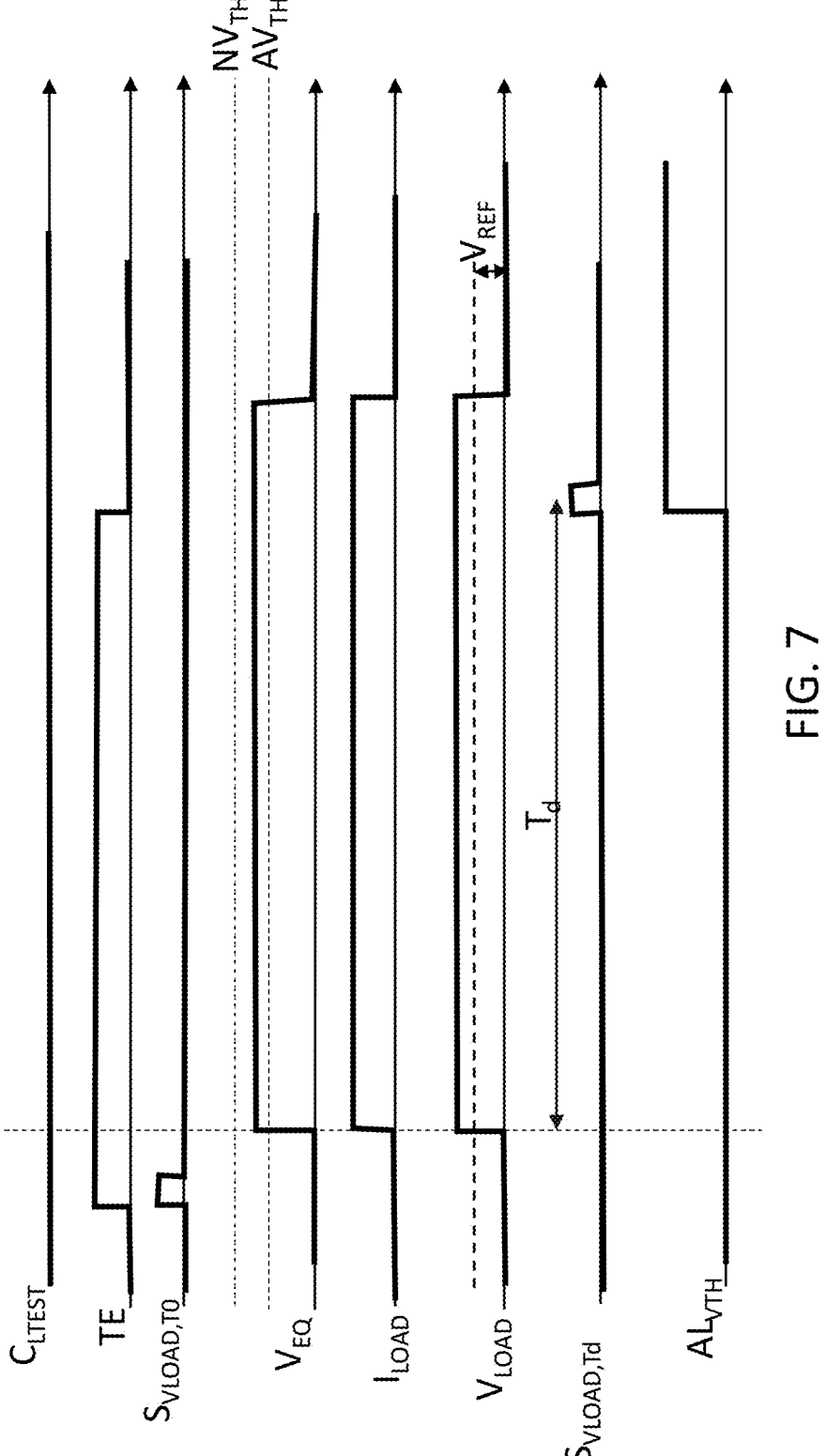
FIG. 7 is a time diagram illustrating the behavior of signals in the circuit of FIG. 5 when the coupled external device is off and may be modeled as a resistive load according to embodiments of the present description.

FIG. 7 is a time diagram illustrating the behavior of signals in the monitoring circuit MC of FIG. 5 when the coupled external device 300, i.e., the coupled load 300, is in an OFF state and may be modeled as a resistive $R_{LOAD}$ load according to embodiments of the present description.

As illustrated in FIG. 7, the connect load test signal $C_{LTEST}$ supplied by the timing block 400 to the third switch 420 is set, for instance, to a low logic level, indicating to such third switch 420 to open in order to decouple the current source 200 from the source terminal S of the Power MOSFET 100. Therefore, the test current $I_{TEST}$ is not flowing within the load 300.

In such a condition, if a test is enabled, for instance, by setting the test enable signal TE to a high logic level, the timing block 400 is configured to indicate, for instance, by sending a pulse on the first load voltage sampling signal $S_{VLOAD,T0}$ or by switching it to a high logic level, to the first sample and hold block 410 to sample the sensed value of the voltage $V_{LOAD}$ before any changes in the operation of the monitoring circuit MC, i.e., when the gate-source voltage $V_{GS}$ of the Power MOSFET 100 is substantially equal to zero and the load is in a non-conductive OFF state.

As previously described, in response to the first sample and hold block 410 sampling the sensed value of the voltage $V_{LOAD}$, the timing block 400 is configured to indicate, for instance, by setting the voltage equality signal $V_{EQ}$ to a high logic level, to the second switch 406 that the voltage generator 404 is to be coupled to the gate terminal G of the Power MOSFET 100, to modify the value of the gate-source voltage Vas, setting its value to a value substantially equal to the voltage $V_{TEST}$.

It is noted that, in various embodiments, for instance, in the embodiment of FIG. 7, the voltage equality signal $V_{EQ}$ may be set to a voltage level equal to the test voltage $V_{TEST}$ supplied by the voltage generator 404 in order to indicate to the second switch 406 to couple the voltage generator 404 to the Power MOSFET 100.

Therefore, when the second switch 406 couples the voltage generator 404 with the gate terminal G of the Power MOSFET 100, such voltage generator 404 supplies the test voltage $V_{TEST}$ between the gate terminal G and the source terminal S of the Power MOSFET 100, thus, modifying the value of the gate-source voltage $V_{GS}$.

If the actual threshold voltage $AV_{TH}$ is higher than the test voltage $V_{TEST}$ supplied by the voltage generator 404, the Power MOSFET 100 remains in a non-conductive OFF state, thus, there is no current $I_{LOAD}$ flowing within the load 300 and the voltage $V_{LOAD}$ on the load 300 remains of the same value that has been previously sampled by the first sample and hold block 410.

In such a case, the sensed value of the voltage $V_{LOAD}$ sampled by the second sample and hold block 412 will be substantially equal to the one sampled by the first sample and hold block 410. Thus, the result of the subtraction from the subtracting block 414 or the voltage variation provided by the detection unit 408-414 will result in a value that is substantially equal to zero.

Conversely, as previously described, if the actual threshold voltage $AV_{TH}$ is shifted from the nominal threshold voltage $NV_{TH}$, for instance, because of physical degradations of the gate structure, so that the actual threshold voltage $AV_{TH}$ is equal to or lower than the test voltage $V_{TEST}$ supplied by the voltage generator 404 (as shown in FIG. 7), the Power MOSFET 100 may change its state from a non-conductive OFF state to a conductive ON state, since the voltage applied between its gate terminal G and its source terminal S, i.e., the test voltage $V_{TEST}$, is higher than the actual threshold voltage $AV_{TH}$ value.

In response to the Power MOSFET 100 changing its state to a conductive ON state, a current $I_{DS}$ starts flowing between the drain terminal D and the source terminal S of the Power MOSFET 100 and, as a consequence, within the load 300, i.e., a resistive load.

Thus, as illustrated in FIG. 7, a variation of both the voltage $V_{LOAD}$ on the load 300 and of the current $I_{LOAD}$ within the load 300 are observed, in particular, the value of such current $I_{LOAD}$ may be obtained using the following formula:

$$I_{LOAD} = (V_{TEST} - AV_{TH}) * G_M$$

wherein $G_M$ is the transconductance of the Power MOSFET, and the value of such voltage $V_{LOAD}$ on the load 300 may be obtained using the formula:

$$V_{LOAD} = I_{LOAD} * R_{LOAD}$$

Therefore, the resistive load 300, which is composed only of a resistive component $R_{LOAD}$, may be used as a current sensor to check if the Power MOSFET 100 has changed its state from a non-conductive OFF state to a conductive ON state.

Independently from the value of the actual threshold voltage $AV_{TH}$, after a given time equal to $T_d$, the timing block 400 is further configured to indicate, for instance, by sending a pulse on the second load voltage sampling signal $S_{VLOAD,Td}$ or by switching it to a high logic level, to the second sample and hold block 412 to sample the sensed value of the voltage $V_{LOAD}$.

After such time $T_d$ from the setting of the gate-source voltage Vas to the voltage $V_{TEST}$, the Power MOSFET 100 may have changed its state from a non-conductive OFF state to a conductive ON state and a variation of both the voltage $V_{LOAD}$ on the load 300 and of the current $I_{LOAD}$ within the load 300 may have been observed.

In particular, if the actual threshold voltage $AV_{TH}$ is higher than the test voltage $V_{TEST}$ supplied by the voltage generator 404, the sensed value of the voltage $V_{LOAD}$ sampled by the second sample and hold block 412 is substantially equal to the one sampled by the first sample and hold block 410.

Conversely, if the actual threshold voltage $AV_{TH}$ is equal to or lower than the test voltage $V_{TEST}$ supplied by the voltage generator 404, the sensed value of the voltage $V_{LOAD}$ sampled by the second sample and hold block 412 is different from, i.e., higher than, the one sampled by the first sample and hold block 410 and equal to $V_{LOAD}=I_{LOAD}*R_{LOAD}$.

Thus, the subtracting block 414 may subtract the sensed voltage $V_{LOAD}$ received from the second sample and hold block 412, i.e., the voltage $V_{LOAD}$ sensed after such time $T_d$ from the setting of the gate-source voltage Vas to the voltage $V_{TEST}$, i.e., when such load 300 may have changed its state to a conductive state, from the sensed voltage $V_{LOAD}$ received from the first sample and hold block 410, i.e., the voltage $V_{LOAD}$ sensed before any modification in the operation of the monitoring circuit MC, i.e., with such load 300 in a non-conductive off state, obtaining a value indicative of the voltage variation on the load 300 during such period of time T.

If the actual threshold voltage $AV_{TH}$ is equal to or lower than the test voltage $V_{TEST}$ supplied by the voltage generator 404, such value indicative of the voltage variation on the load 300 indicates a voltage variation between a conductive state of such load 300 and a non-conductive off state of such load 300.

It is noted that such value indicative of the voltage variation on the load 300 may indicate if a current $I_{LOAD}$ was flowing within the load 300 during the time period $T_d$.

In fact, if the value of the voltage variation is substantially zero, the voltage $V_{LOAD}$ on the load 300 remains substantially stable during the whole time period $T_d$, therefore, the actual threshold voltage $AV_{TH}$ is higher than the test voltage $V_{TEST}$ and a current $I_{LOAD}$ did not flow within such load 300 during such time $T_d$.

Conversely, if the value of the voltage variation is different from zero, the voltage $V_{LOAD}$ on the load 300 varies during the time period $T_d$, therefore, the actual threshold voltage $AV_{TH}$ is equal to or lower than the test voltage $V_{TEST}$ and a current $I_{LOAD}$ flowed within such load 300 during such time $T_d$.

If the reference voltage generator 416 is correctly configured to supply a reference voltage $V_{REF}$ (as illustrated in FIG. 7) whose value is:

smaller than any possible voltage variation that may be obtained when the actual threshold voltage $AV_{TH}$ is equal to or lower than the test voltage $V_{TEST}$, and higher than a minimum value, for instance, a value slightly higher than zero, the comparator 418 may raise an alarm signal $AL_{VTH}$, indicating that the Power MOSFET 100 and the corresponding device, for instance, an E-Fuse, may be at risk of short circuit failures if the value of an obtained voltage variation is higher than such correctly defined reference voltage $V_{REF}$.

In various embodiments, if the first mode or the second mode are selected, the reference voltage $V_{REF}$ may be a voltage referred to a ground terminal GND since the Power MOSFET is initially in a non-conductive OFF state. In such case, for instance, the reference voltage $V_{REF}$ may be illustrated, as in FIGS. 7 and 8, with a double arrow between a first level indicating a corresponding ground voltage, i.e., with a value that is substantially zero, and a second level indicating a voltage value that satisfy the two conditions described above for configuring correctly the reference voltage generator.

A criterion for dimensioning such time $T_d$ is described in the following.

Figure 8:
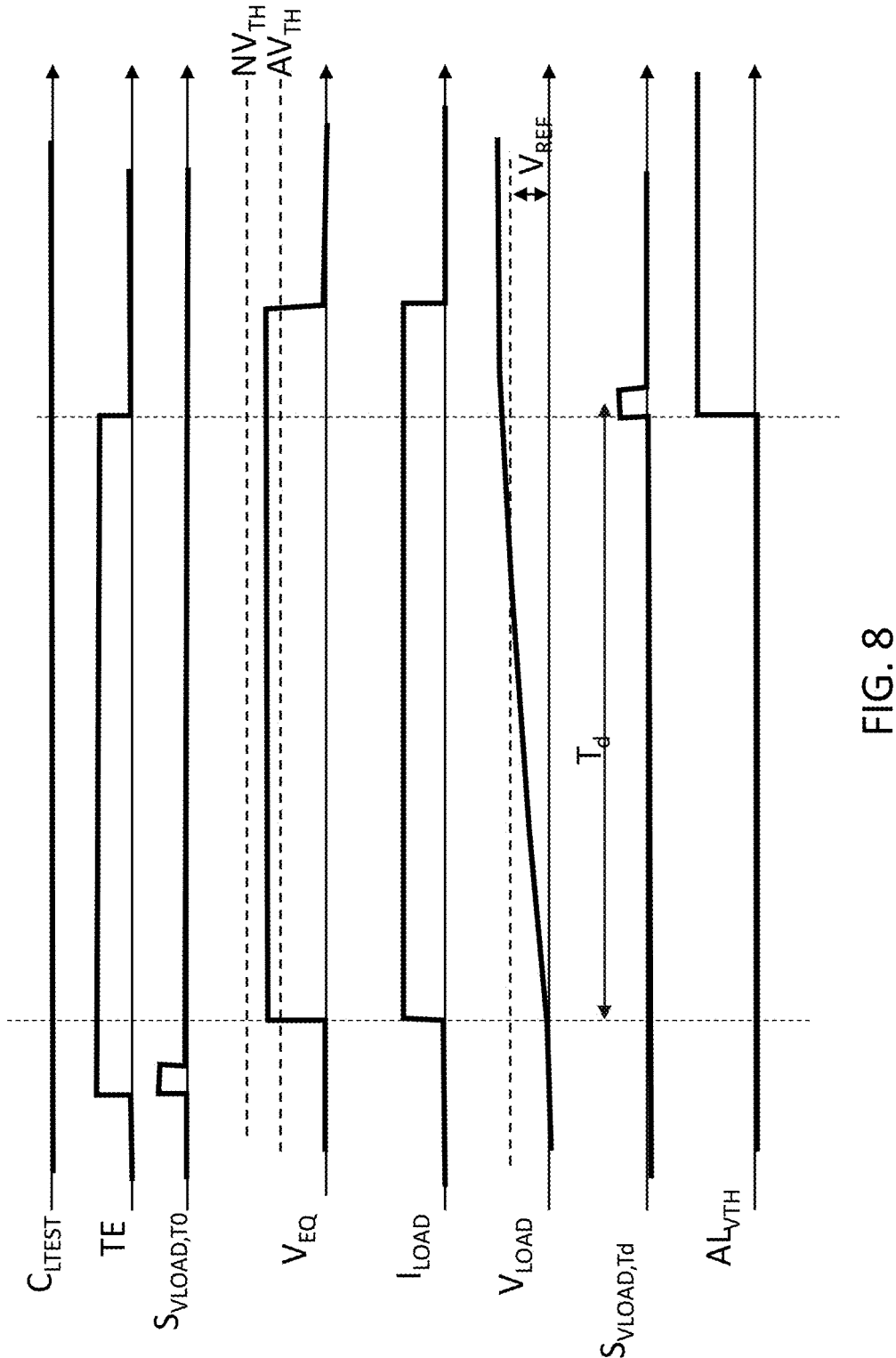
FIG. 8 is a time diagram illustrating the behavior of signals in the circuit of FIG. 5 when the coupled external device is off and may be modeled as a capacitive/resistive load according to embodiments of the present description.

FIG. 8 is a time diagram illustrating the behavior of signals in the monitoring circuit MC of FIG. 5 when the coupled external device 300 is in an OFF state and may be modeled as a capacitive/resistive load according to embodiments of the present description.

Most of the signals illustrated in FIG. 8 behave as the corresponding ones, i.e., the ones denoted by the same references, represented and already described in FIG. 7. For this reason, a description of the behavior and timing of such signals is not repeated in the following in order not to overburden the present detailed description.

Differences between the behavior of signals in FIG. 7 with the behavior of signals in FIG. 8 are obtained by the addition of a capacitive component in the load 300.

If the actual threshold voltage $AV_{TH}$ is higher than the test voltage $V_{TEST}$ supplied by the voltage generator 404, the behavior of the signals obtained using the test mode illustrated in FIG. 8 is equal to that obtained using the test mode illustrated in FIG. 7, therefore, a detailed description for such a case is not described again in the following to not overburden the present description.

Even in embodiments as shown in FIG. 8, if the actual threshold voltage $AV_{TH}$ is shifted from the nominal threshold voltage $NV_{TH}$ until it reaches a value that is equal to or lower than the test voltage $V_{TEST}$ supplied by the voltage generator 404, the Power MOSFET 100 changes its state from a non-conductive OFF state to a conductive ON state, with a consequent variation of both the voltage $V_{LOAD}$ on the load 300 and of the current $I_{LOAD}$ within the load 300.

In response to the addition of such capacitive component $C_{LOAD}$ in the load 300, the voltage $V_{LOAD}$ on the load 300 slowly variates its value as the capacitive component $C_{LOAD}$ of the load 300 is charged (illustrated in FIG. 8).

In particular, the value of such current $I_{LOAD}$ may be obtained using again the formula:

$$I_{LOAD} = (V_{TEST} - AV_{TH}) * G_M$$

while the value of such voltage $V_{LOAD}$ on the load 300 may be obtained using the formula:

$$V_{LOAD} = I_{LOAD} * R_{LOAD} * \left(1 - e^{\frac{-t}{R_{LOAD}*C_{LOAD}}}\right)$$

Therefore, even in embodiments using the test mode illustrated in FIG. 8, the load 300 may be used as a current sensor to check if the Power MOSFET 100 has changed its state from a non-conductive OFF state to a conductive ON state, on condition that the time $T_d$ used as a delay between the first sampling and the second sampling of the sensed voltage $V_{LOAD}$ is dimensioned in order to allow a complete charging of the capacitive component $C_{LOAD}$ of the load 300 before the second sampling operation.

Hence, in various embodiments wherein the load 300 may include a capacitive component $C_{LOAD}$, the time $T_d$ used as a delay between the first sampling and the second sampling of the sensed voltage $V_{LOAD}$ is dimensioned in order to allow the current $I_{LOAD}$ flowing within such coupled load 300 to charge such capacitive component $C_{LOAD}$.

In various embodiments wherein the load 300 is not configured to include a capacitive component $C_{LOAD}$ but only a resistive component $R_{LOAD}$, even if there is a time $T_d$ used as a delay between the first sampling and the second sampling of the sensed voltage $V_{LOAD}$, such time $T_d$ may be much shorter than that of embodiments wherein the load 300 may include a capacitive component $C_{LOAD}$, as the voltage $V_{LOAD}$ on a load 300 comprising only a resistive component $R_{LOAD}$ varies much faster than on a load 300 comprising also a capacitive component $C_{LOAD}$.

In various embodiments, the monitoring circuit MC may be activated when the load 300 is in a standby mode, i.e., when there is a supply voltage $V_{FUSE}$ provided to the load 300 but there is no current flowing within such load 300, for instance, a case when an electronic fuse guarantees a supply voltage $V_{FUSE}$ to the load 300 while such load 300 is in a standby mode and no current is flowing through it.

Usually, in automotive applications, the load 300 may include a bulk capacitor placed in parallel with an automotive load and a corresponding quiescent current, i.e., a current flowing within an integrated circuit when such circuit is in a quiescent state, for example, in a standby mode, has a very low value such that the load 300 may be modeled with a pure capacitive load, neglecting the resistive component.

Figure 9:
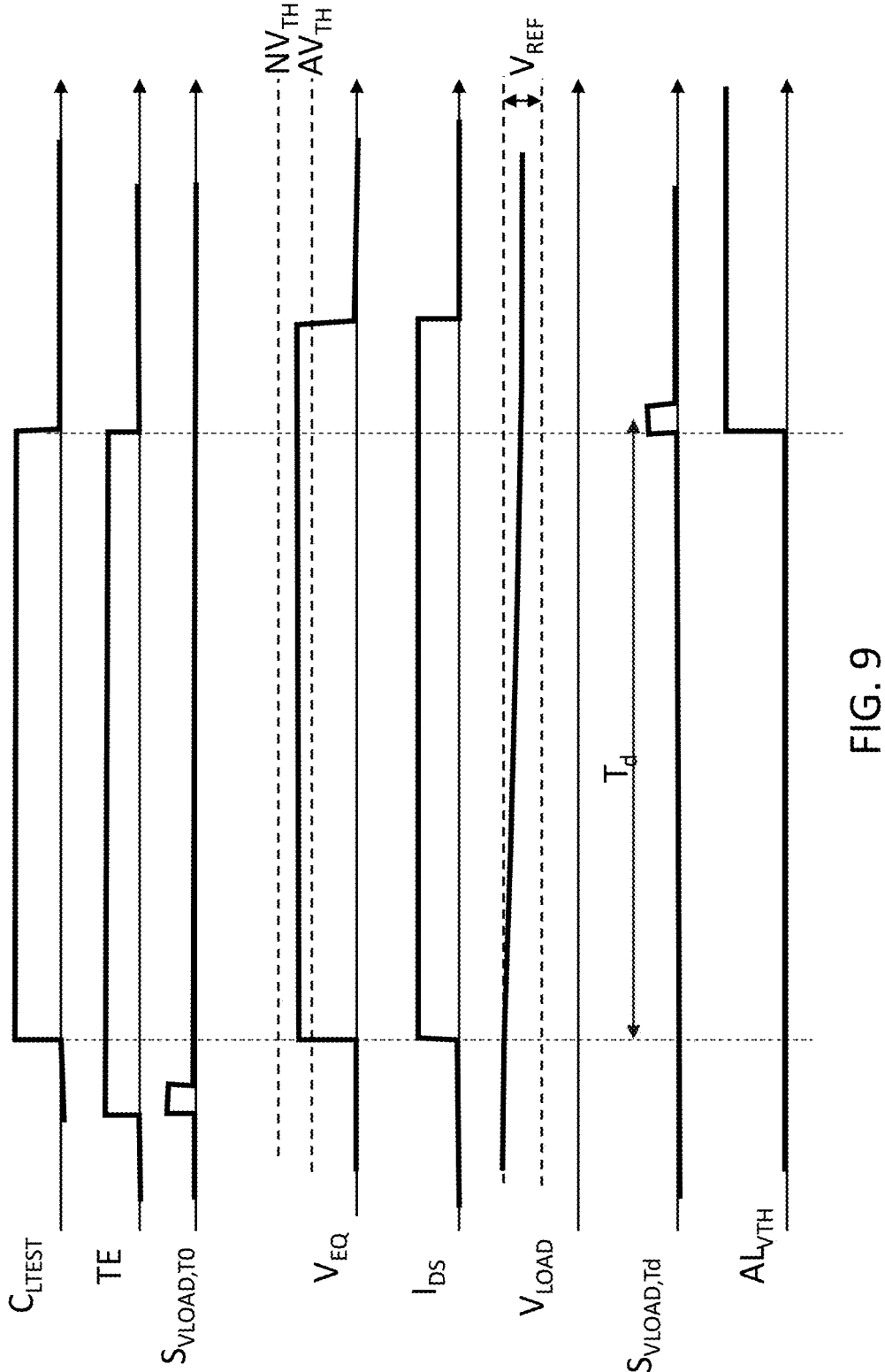
FIG. 9 and FIG. 10 are time diagrams illustrating the behavior of signals in the circuit of FIG. 5 when the coupled external device is on, in a standby mode, and may be modeled as a pure capacitive load according to embodiments of the present description.
Figure 10:
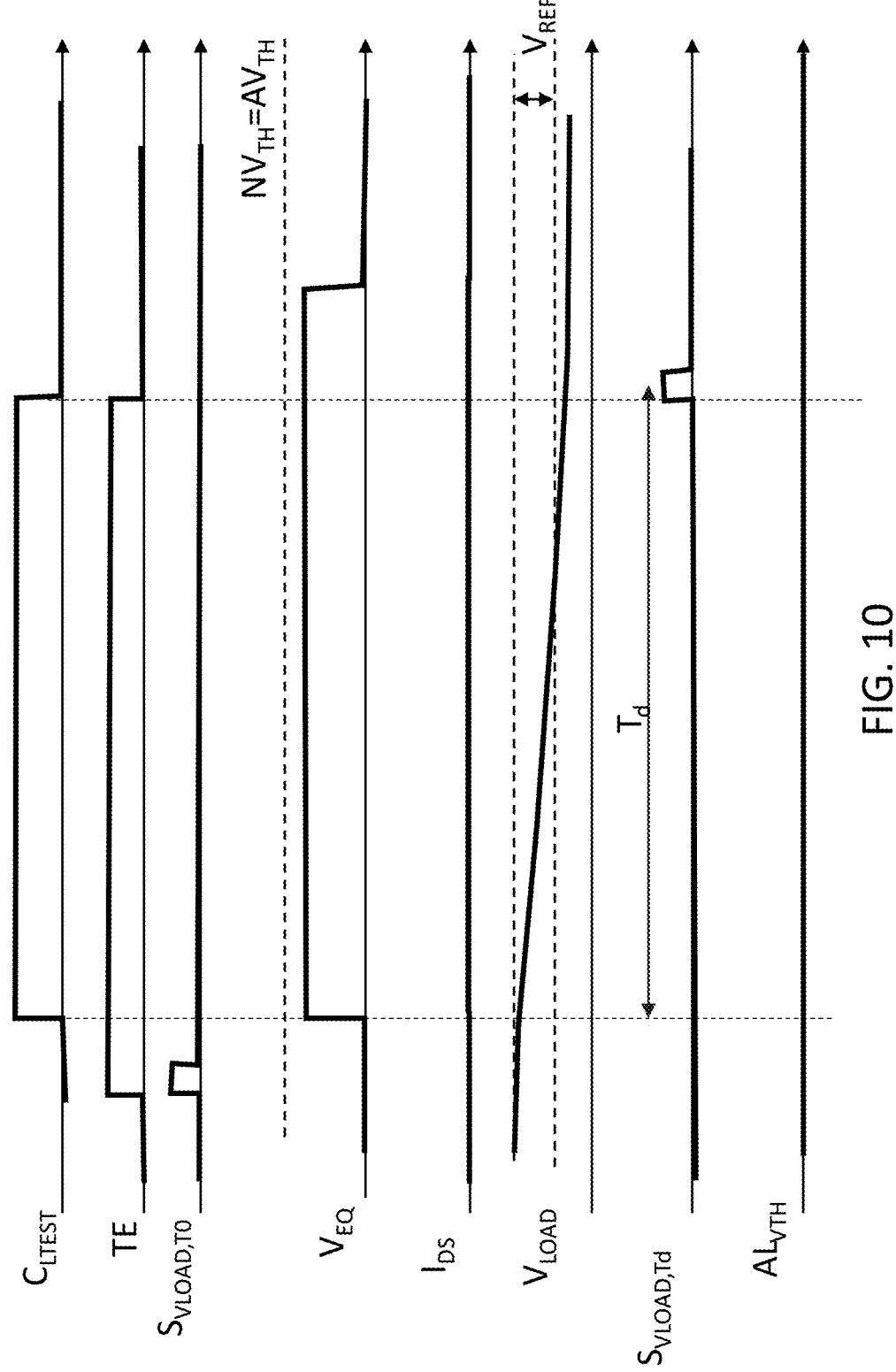

Therefore, the embodiments of FIGS. 9 and 10 are described considering a pure capacitive load, i.e., a load 300 containing only a capacitive component $C_{LOAD}$.

In embodiments wherein the load 300 may be modeled as a pure capacitive load, the Power MOSFET 100, or a corresponding device, for instance, an E-Fuse, can be turned off for a short time, i.e., for a time equal to a delay $T_d$, and during such short time a low test current $I_{TEST}$ can be sink from such load 300, for instance, by using a dummy load as the current generator 200. If such test current $I_{TEST}$ is sufficiently low, the capacitive component, for instance, a bulk capacitance, discharging is low enough to avoid an undervoltage condition on such load 300.

FIG. 9 and FIG. 10 are time diagrams illustrating the behavior of signals in the monitoring circuit MC of FIG. 5 when the coupled external device 300, modeled as a pure capacitive load, is in an ON state and in a standby mode according to embodiments of the present description.

In particular, FIG. 9 illustrates the behavior of signals in the monitoring circuit MC of FIG. 5 when coupled to an external device 300, modeled as a pure capacitive load, that is in an ON state and in a standby mode, and the actual value of the threshold voltage $AV_{TH}$ is smaller than or equal to the test voltage $V_{TEST}$, and, as a consequence, of the nominal value of the threshold voltage $NV_{TH}$.

As shown in FIG. 9, if a test is enabled, for instance, by setting the test enable signal TE to a high logic level, the timing block 400 is configured to indicate, for instance, by sending a pulse on the first load voltage sampling signal $S_{VLOAD,T0}$ or by switching it to a high logic level, to the first sample and hold block 410 to sample the sensed value of the voltage $V_{LOAD}$ before any changes in the operation of the circuit, i.e., when the gate-source voltage $V_{GS}$ of the Power MOSFET 100 is substantially equal to zero and the load 300 is in a standby mode, i.e., there is a supply voltage $V_{FUSE}$ provided to the load 300 but there is no current flowing within such load 300.

In response to the first sample and hold block 410 sampling the sensed value of the voltage $V_{LOAD}$, the connect load test signal $C_{LTEST}$ supplied by the timing block 400 to the third switch 420 is switched, for instance, from a low logic level to a high logic level, indicating to such third switch 420 to close in order to couple the current source 200 to the source terminal S of the Power MOSFET 100. In this way, the test current $I_{TEST}$ start flowing within the load 300, discharging the capacitive component of such load 300.

In addition, again in in response to the first sample and hold block 410 sampling the sensed value of the voltage $V_{LOAD}$, the timing block 400 is configured to indicate, for instance, by setting the voltage equality signal $V_{EQ}$ to a high logic level, to the second switch 406 that the voltage generator 404 is to be coupled to the gate terminal G of the Power MOSFET 100, to modify the value of the gate-source voltage Vas, setting its value to a value substantially equal to the voltage $V_{TEST}$.

Even in embodiments as the one shown in FIG. 9, it is noted that, for instance, the voltage equality signal $V_{EQ}$ may be set to a voltage level equal to the test voltage $V_{TEST}$ supplied by the voltage generator 404 in order to indicate to the second switch 406 to couple the voltage generator 404 to the Power MOSFET 100.

Therefore, when the second switch 406 couples the voltage generator 404 with the gate terminal G of the Power MOSFET 100, such voltage generator 404 supplies the test voltage $V_{TEST}$ between the gate terminal G and the source terminal S of the Power MOSFET 100, thus, modifying the value of the gate-source voltage $V_{GS}$.

As illustrated in FIG. 9, if the actual threshold voltage $AV_{TH}$ is shifted from the nominal threshold voltage $NV_{TH}$ of an amount so that the actual threshold voltage $AV_{TH}$ is equal to or lower than the test voltage $V_{TEST}$ supplied by the voltage generator 404, the Power MOSFET 100 changes its state from a non-conductive OFF state to a conductive ON state, as the voltage applied between its gate terminal G and its source terminal S, i.e., the test voltage $V_{TEST}$, is higher than the actual threshold voltage $AV_{TH}$ value.

In response to the Power MOSFET 100 changing its state from a non-conductive OFF state to a conductive ON state, a current $I_{DS}$ starts flowing between the drain terminal D and the source terminal S of the Power MOSFET 100, such current $I_{DS}$ substantially corresponding to the test current $I_{TEST}$ generated by the current source 200.

Since the test current $I_{TEST}$ generated by the current source 200 flows mainly within the Power MOSFET 100, the voltage $V_{LOAD}$ on the corresponding load 300 may change of an amount that is smaller than a given threshold, for instance, smaller than a value selected for the reference voltage $V_{REF}$ generated by the reference voltage generator 416.

Therefore, such reference voltage $V_{REF}$ generated by the reference voltage generator 416 may be considered as a threshold and used to check if the Power MOSFET 100 has changed its state from a non-conductive OFF state to a conductive ON state.

In fact, if the voltage $V_{LOAD}$ on the load 300 changes of an amount that is smaller than the value of such threshold, i.e., of such reference voltage $V_{REF}$, the corresponding Power MOSFET 100 is characterized by an actual threshold voltage $AV_{TH}$ value that is smaller than the test voltage $V_{TEST}$ supplied by the voltage generator 404, i.e., is smaller than a selected minimum value and may be at risk of short circuit failures.

Then, after a given time equal to $T_d$, the timing block 400 is further configured to indicate, for instance, by sending a pulse on the second load voltage sampling signal $S_{VLOAD,Td}$ or by switching it to a high logic level, to the second sample and hold block 412 to sample the sensed value of the voltage $V_{LOAD}$ after the setting of the gate-source voltage Vas to the voltage $V_{TEST}$, thus, when the Power MOSFET 100 has changed its state from a non-conductive OFF state to a conductive ON state and the test current $I_{TEST}$ generated by the current source 200 is flowing within such MOSFET 100.

In this way, the subtracting block 414 may subtract the sensed the voltage $V_{LOAD}$ received from the second sample and hold block 412, i.e., the voltage $V_{LOAD}$ sensed after the Power MOSFET 100 changes its state from a non-conductive OFF state to a conductive ON state, from the sensed the voltage $V_{LOAD}$ received from the first sample and hold block 410, i.e., the voltage $V_{LOAD}$ sensed before any change in the operations of the monitoring circuit MC of FIG. 5, obtaining a value indicative of the voltage variation on the load 300 during the time $T_d$.

Such value indicative of the voltage variation on the load 300 during the time $T_d$ may indicate if a current $I_{LOAD}$ equal to the test current $I_{TEST}$ was flowing within the load 300 during the time $T_d$.

In fact, if the value of the voltage variation is smaller than the selected threshold, i.e., the reference voltage $V_{REF}$, the voltage $V_{LOAD}$ on the load 300 decreased by an amount that is smaller than such selected threshold during the time $T_d$, thus, a current $I_{LOAD}$ of value equal to the test current $I_{TEST}$ flows within the Power MOSFET 100 and not within such load 300 during such time $T_d$.

Conversely, FIG. 10 illustrates the behavior of signals in the monitoring circuit MC of FIG. 5 when coupled to an external device 300, modeled as a pure capacitive load, that is in an ON state and in a standby mode, and wherein the actual value of the threshold voltage $AV_{TH}$ is comprised in a range between the test voltage $V_{TEST}$ and the nominal value of the threshold voltage $NV_{TH}$ (for instance, without losing generality for the following description, in FIG. 10 the actual value of the threshold voltage $AV_{TH}$ is considered equal to the nominal value of the threshold voltage $NV_{TH}$).

It is noted that a description for signals of FIG. 10 that behave as the corresponding ones, i.e., the ones denoted by the same references, represented and already described in FIG. 9 is not repeated in the following in order not to overburden the present detailed description.

In such a condition, the Power MOSFET 100 do not change its state into a conductive ON state in response to the connect load test signal $C_{LTEST}$ indicating to close the third switch 420, coupling the current source 200 to the source terminal S of the Power MOSFET 100, and the voltage equality signal $V_{EQ}$ indicating to close the second switch 406, coupling the voltage generator 404 to the gate terminal G of the Power MOSFET 100.

Even in this case, the gate-source voltage Vas of the Power MOSFET 100 is set to the test voltage $V_{TEST}$ but since the actual threshold voltage $AV_{TH}$ is higher than such test voltage $V_{TEST}$ the Power MOSFET 100 remains in a non-conductive OFF state.

Thus, a current $I_{DS}$ is not flowing between the drain terminal D and the source terminal S of the Power MOSFET 100 and the test current $I_{TEST}$ generated by the current source 200 discharge the capacitive component of the load 300, lowering the value of the voltage $V_{LOAD}$ on the load 300.

In response to the discharging of the capacitive component of the load 300 by the test current $I_{TEST}$, the voltage $V_{LOAD}$ on the load 300 decrease over time of an amount that is higher than a given threshold, for instance, higher than the selected value for the reference voltage $V_{REF}$ generated by the reference voltage generator 416.

Therefore, if the voltage $V_{LOAD}$ on the load 300 changes of an amount that is higher than such threshold, i.e., than such reference voltage $V_{REF}$, the corresponding Power MOSFET 100 is characterized by an actual threshold voltage $AV_{TH}$ value that is higher than the test voltage $V_{TEST}$ supplied by the voltage generator 404, i.e., is higher than the selected minimum value and is not at risk of short circuit failures.

In embodiments as illustrated in FIG. 10, the value of the voltage variation provided by the subtracting block 414 is higher than the selected threshold, i.e., the reference voltage $V_{REF}$, as the voltage $V_{LOAD}$ on the load 300 decreased of an amount that is higher than such selected threshold during the time $T_d$, thus, a current $I_{LOAD}$ of value equal to the test current $I_{TEST}$ flowed within such load 300 during such time $T_d$, discharging the capacitive component of such load 300.

Therefore, if the reference voltage generator 416 is correctly configured to supply a reference voltage $V_{REF}$ (as illustrated in FIG. 9) whose value is:

higher than any possible voltage variation obtained when the Power MOSFET 100 is in a conductive ON state, and smaller than any possible voltage variation obtained when the Power MOSFET 100 is in a non-conductive OFF state, the comparator 418 may raise an alarm signal $AL_{VTH}$, indicating that the Power MOSFET 100 and the corresponding device, for instance, an E-Fuse, may be at risk of short circuit failures if the value of an obtained voltage variation is smaller than such correctly defined reference voltage $V_{REF}$ (as illustrated in FIG. 9).

Otherwise, if the comparator 418 detects that the value of an obtained voltage variation is higher than such correctly defined reference voltage $V_{REF}$, the alarm signal $AL_{VTH}$ is not set, for instance, remaining to a low logic level (as illustrated in FIG. 10).

In various embodiments, if the third mode is selected, the reference voltage $V_{REF}$ may be a voltage referred to the voltage $V_S$ since the Power MOSFET is initially in a conductive ON state. In such case, for instance, the reference voltage $V_{REF}$ may be illustrated, as in FIGS. 9 and 10, with a double arrow between a first level indicating such voltage $V_S$ and a second level indicating a voltage value that satisfy the two conditions described above for configuring correctly the reference voltage generator.

In the embodiments illustrated in FIGS. 9 and 10, to correctly set the value of the reference voltage $V_{REF}$ generated by the reference voltage generator 416 the following equation may be considered:

$$I_{TEST} = C_{LOAD} * \frac{dV_{LOAD}}{dT_d}$$

wherein $$\frac{dV_{LOAD}}{dT_d}$$

is the voltage variation over the time period $T_d$ provided by the subtracting block 414 or the detection unit 408-414.

In various embodiments wherein the load 300 may be modeled as a pure capacitive component, as in embodiments of FIGS. 9 and 10, the time $T_d$ used as a delay between the first sampling and the second sampling of the sensed voltage $V_{LOAD}$ may be shorter than that of embodiments wherein the load 300 may include both a resistive component and a capacitive component, as in embodiments of FIG. 8.

In fact, in embodiments of FIGS. 9 and 10 the voltage variation measured on the load 300 that may allow detecting an anomaly is much smaller than the one in embodiments of FIG. 8, as the capacitive component is to be partially, and not fully, discharged/charged, thus, having a shorter time period $T_d$.

Figure 11:
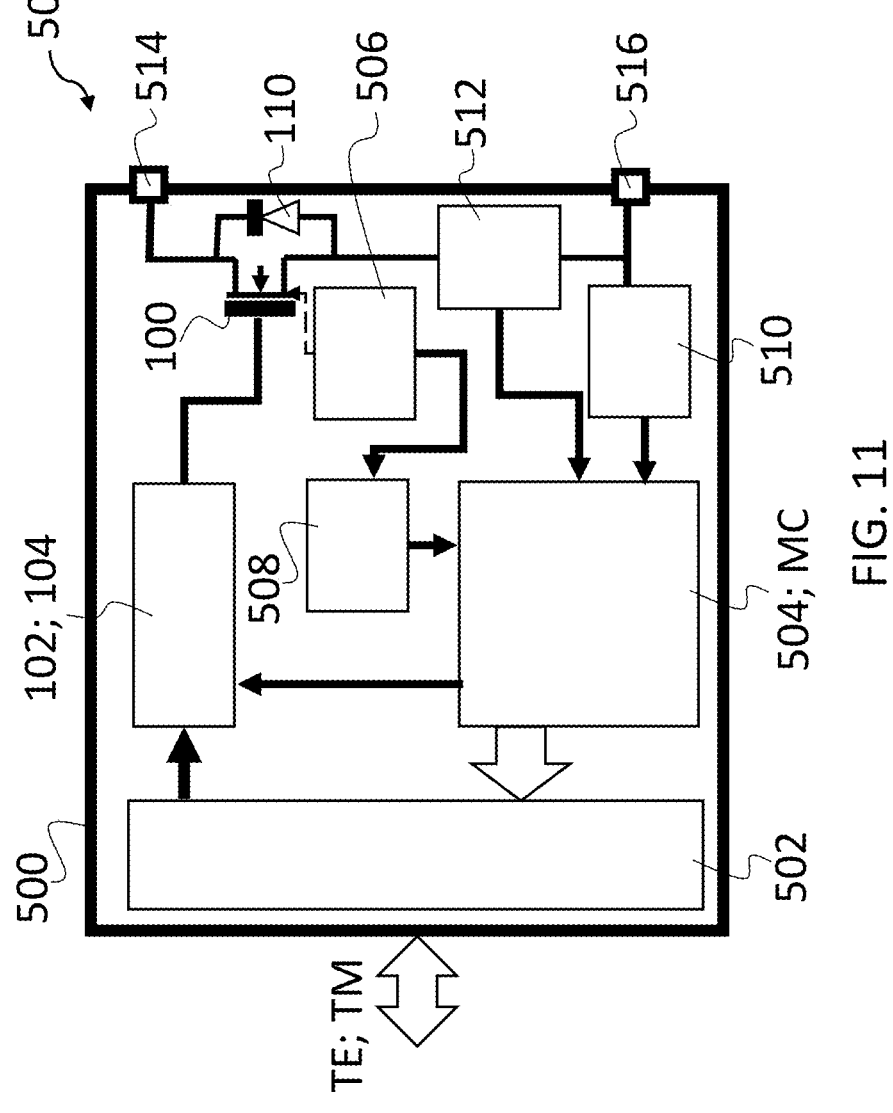
FIG. 11 is a system comprising the circuit of FIG. 5 and a temperature variation monitoring unit according to embodiments of the present description.

FIG. 11 is a system 50 comprising the monitoring circuit MC of FIG. 5 and a temperature variation monitoring unit 506-508 according to embodiments of the present description.

The threshold voltage $V_{TH}$ of a Power MOSFET 100 decreases in response to increasing temperatures. Therefore, in various embodiments, the test voltage $V_{TEST}$ supplied by the voltage generator 404 is to be compensated for the temperature effects, i.e., in order to maintain a same chosen gap amount $V_{GAP}$ between such test voltage $V_{TEST}$ and the nominal value of the threshold voltage $NV_{TH}$ which changes with temperature values.

The compensation of the drift of the threshold voltage $V_{TH}$ resulting from a temperature variation is done by using a thermal sensor 506 that is configured to monitor the temperature of the Power MOSFET 100 junction (dashed arrow), and to send the sensed temperature values to a compensation block 508.

Such compensation block 508 is configured to receive the sensed temperature values from the thermal sensor 506 and to compute as a function of such sensed temperature values a corresponding value for the test voltage $V_{TEST}$ that is to be generated by the voltage generator 404 of a monitoring circuit 504, corresponding to the monitoring circuit MC of FIG. 5.

In this way, the computed value for the test voltage $V_{TEST}$ may be updated dynamically according to the temperature changes of the Power MOSFET 100 in order to keep a gap of constant value $V_{GAP}$ between the nominal threshold voltage $NV_{TH}$ and the test voltage $V_{TEST}$.

Such compensation block 508 is further configured to provide such computed value for the test voltage $V_{TEST}$ to the monitoring circuit 504, in particular, to the voltage generator 404.

The monitoring circuit 504, corresponding to the monitoring circuit MC of FIG. 5, and, in particular, the voltage generator 404 is configured to generate a voltage of a value equal to the computed value for the test voltage $V_{TEST}$ received from the compensation block 508.

In various embodiments, the monitoring circuit 504 may further receive current feedback and/or voltage feedback through an ammeter 512 and a voltmeter 510 respectively.

In various embodiments, the monitoring circuit 504 may be coupled to a communication interface 502, for instance, to receive the test enable signal TE and the test mode signal TM from an external unit.

In various embodiments, the thermal sensor 506 and the compensation block 508 may be integrated within the same unit, for instance, within a smart power actuator that comprises a thermal sensor integrated inside the structure of the Power MOSFET.

In various embodiments, the system 50 may be used for automotive applications, for instance, by coupling an upper pin 514 to an automotive power distribution source, for instance, a battery, and a lower pin 516 to a vehicle utility system or to an ECU.

In various embodiments, the system 50 may be used for automotive applications in contexts of vehicle diagnostic and monitoring systems, multiple and backup power systems, redundant braking systems, redundant electrical power steering system, and/or the like.

In various embodiments, the monitoring circuit MC of FIG. 5 may be embedded inside a power actuator or an E-Fuse.

The various units and blocks discussed in the present disclosure include, for example, various electronic components and circuitry configured to perform the functions of the units discussed above.

Solutions as described herein facilitate obtaining monitoring circuits for an early detection of short circuit failures in MOSFETs. This may be achieved by measuring the actual threshold voltage value of a given MOSFET while such MOSFET is coupled with a corresponding load.

Thus, solutions as described herein facilitate achieving the health monitoring of devices, for instance, E-Fuses, through the monitoring of corresponding MOSFETs so as to prevent short circuit failures in such MOSFETs. In this way, it may be possible to have an early prognosis on the degradation of both such MOSFETs and corresponding devices and to prevent potential failures resulting in uncontrolled conduction.

Without prejudice to the underlying principles, the details and the embodiments may vary, even significantly, with respect to what has been described by way of example without departing from the scope of the embodiments.

Circuit (MC) for monitoring an actual threshold voltage value ($AV_{TH}$) of a MOSFET (100) may be summarized as including: a current source (200), configured to be coupled to a source terminal(S) of the MOSFET (100) and to generate a test current ($I_{TEST}$), a voltage generator (404), configured to be coupled between a gate terminal (G) of the MOSFET (100) and the source terminal(S) of the MOSFET (100), and to generate a test voltage ($V_{TEST}$), said test voltage ($V_{TEST}$) being lower than a nominal threshold voltage value ($NV_{TH}$) of the MOSFET (100), a detection unit (408-414), configured to sample a plurality of voltage value ($V_{LOAD}$) at the source terminal(S) of the MOSFET (100) during time, to compute as a function of said plurality of voltage value ($V_{LOAD}$) at least a value of voltage variation over time, in particular over a given time period (Ta), of said voltage value ($V_{LOAD}$) at the source terminal(S) of the MOSFET (100), and to provide said computed at least a value of voltage variation to an alarm generation unit (416-418), the alarm generation unit (416-418) being configured to receive said computed voltage variation from the detection unit (408-414), to compare said computed voltage variation with a reference voltage ($V_{REF}$), and to raise an alarm ($AL_{VTH}$) if the output of said comparison does not correspond to a predetermined output condition, and a control unit (400), configured to receive a test mode signal (TM), indicative of an operation mode, wherein said control unit (400) is further configured to, according to said received test mode signal (TM), select the status of coupling or decoupling of said current source (200) to/from the source terminal(S) of the MOSFET (100), determine the value of said reference voltage ($V_{REF}$), set said output condition of said comparison, and signal to the detection unit (408-414) to perform a plurality of said sampling operation.

If said test mode signal (TM) indicates a first test mode said control unit (400) may be configured to: decouple said current source (200) from the source terminal(S) of the MOSFET (100), determine the value of said reference voltage ($V_{REF}$) so that said reference voltage ($V_{REF}$) is a positive voltage smaller than any possible value of said computed voltage variation obtained when the value of the actual threshold voltage ($AV_{TH}$) is equal to or lower than the test voltage ($V_{TEST}$), and set as said predetermined output condition a result of the comparison between said computed voltage variation and said reference voltage ($V_{REF}$) indicating that said computed voltage variation is higher than said reference voltage ($V_{REF}$). While if said test mode signal (TM) indicates a second mode said control unit (400) may be further configured to: couple said current source (200) to the source terminal(S) of the MOSFET (100), determine the value of said reference voltage ($V_{REF}$) so that said reference voltage ($V_{REF}$) is higher than any possible value of said computed voltage variation obtained when the value of the actual threshold voltage ($AV_{TH}$) is equal to or lower than the test voltage ($V_{TEST}$) and smaller than any possible value of said computed voltage variation obtained when the value of the actual threshold voltage ($AV_{TH}$) is higher than the test voltage ($V_{TEST}$), and set as said predetermined output condition a result of the comparison between said computed voltage variation and said reference voltage ($V_{REF}$) indicating that said computed voltage variation may be smaller than said reference voltage ($V_{REF}$).

Said test mode signal (TM) may be configured to indicate a first submode of said first test mode and a second submode of said first mode, wherein in the first submode mode said given time period (Ta) is shorter than the period in the second mode.

Said circuit (MC) may be coupled to an external load (300) through the source terminal(S) of the MOSFET (100), and the test mode signal (TM) may select an operation mode in a set of available operation modes, said set of available operation modes comprising at least: said first mode, selected when the coupled external load (300) is in an off state, said first mode comprising said first submode corresponding to a resistive load ($R_{LOAD}$) and said second submode corresponding to a load comprising both a capacitive component ($C_{LOAD}$) and a resistive component ($R_{LOAD}$), and said second mode, selected when the coupled external load (300) is in an on state, in a standby mode, and the load may correspond to a capacitive load ($C_{LOAD}$).

Said MOSFET (100) may be a Power MOSFET.

Said plurality of voltage value ($V_{LOAD}$) may include a first voltage value (410) and a second voltage value (412), said first voltage value (410) being retrieved at the beginning of the given time period (Ta) while said second voltage value (412) being retrieved at the end of the given time period ($T_d$), and said compute operation to obtain the voltage variation as a function of said plurality of voltage value ($V_{LOAD}$) comprises subtracting (414) said second voltage value (412) from said first voltage value (410).

Circuit (MC), wherein said detection unit (408-414) may include: a sensing unit (408), configured to sense voltage values ($V_{LOAD}$) at the source terminal(S) of the MOSFET (100) and to forward said sensed voltage values ($V_{LOAD}$) to a first sample and hold block (410) and to a second sample and hold block (412), the first sample and hold block (410), configured to sample said first voltage value in response to the reception of a signal from the control unit (400) indicating to perform a first of said sampling operation, to hold said first voltage value for an amount of time larger than said given time period ($T_d$), and to provide said first voltage value to a subtracting block (414), the second sample and hold block (412), configured to sample said second voltage value in response to the reception of a signal from the control unit (400) indicating to perform a second of said sampling operation, to hold said second voltage value, and to provide said second voltage value to the subtracting block (414), and the subtracting block (414), configured to receive the first voltage value from the first sample and hold block (410) and the second voltage value from the second sample and hold block (412), to perform said subtracting (414) of said second voltage value from said first voltage value obtaining said voltage variation, and to provide said voltage variation to the alarm generation unit (416-418).

Said alarm generation unit (416-418) may include: a reference voltage generator (416), configured to provide a comparator block (418) with said reference voltage ($V_{REF}$), and the comparator block (418), configured to receive said computed voltage variation from the detection unit (408-414) and said reference voltage ($V_{REF}$) from the reference voltage generator (416), to compare said computed voltage variation with said reference voltage ($V_{REF}$), and to raise an alarm ($AL_{VTH}$) in response to an unsuccessful comparison operation.

Said circuit (MC) further may include: a first switch (420), configured to couple or decouple said current source (200) to the source terminal(S) of the MOSFET (100) in response to the reception of a signal from the control unit (400) issued as a function of said test mode signal (TM).

Said circuit (MC) may further include an additional switch (402) configured to decouple a gate driver (104) from the gate terminal (G) of the MOSFET (100) in response to the reception of a signal from the control unit (400) indicating to start the monitoring of said actual threshold voltage value ($AV_{TH}$), and to couple the gate driver (104) to the gate terminal (G) of the MOSFET (100) in response to the reception of a signal from the control unit (400) indicating to end the monitoring of said actual threshold voltage value ($AV_{TH}$).

Said test voltage ($V_{TEST}$) may be fixed, or said test voltage ($V_{TEST}$) may be dynamic and said control unit (400) may be further configured to: select an initial value for said test voltage ($V_{TEST}$), start the monitoring of said actual threshold voltage value ($AV_{TH}$), if the alarm generation unit (416-418) do not raise any alarm ($AL_{VTH}$) before the end of the monitoring of said actual threshold voltage value ($AV_{TH}$), increase the value of said test voltage ($V_{TEST}$) of a given step and perform again the steps from the starting of the monitoring, and—if the alarm generation unit (416-418) raises an alarm ($AL_{VTH}$) before the end of the monitoring of said actual threshold voltage value ($AV_{TH}$), identify the current value of the test voltage ($V_{TEST}$) as the value of the actual threshold voltage value ($AV_{TH}$).

Said circuit (MC) may be further coupled with a temperature monitoring unit (506-508), said temperature monitoring unit (506-508) being configured to: monitor (506) a temperature of the MOSFET (100) to sense at least one temperature value, and compute (508) a value for said test voltage ($V_{TEST}$) as a function of said at least one sensed temperature value, and provide (508) said value for said test voltage ($V_{TEST}$) to the circuit (MC) to generate a test voltage ($V_{TEST}$) of said value through the voltage generator (404).

Said circuit (MC) may include a further switch (406), configured to couple or decouple said voltage generator (404) to the gate terminal (G) of the MOSFET (100) in response to the reception of a signal from the control unit (400) issued as a function of said test mode signal (TM), and in said first and second mode said voltage generator (404) is maintained coupled from the gate terminal (G) of the MOSFET (100).

In said first and second mode said voltage generator (404) may be decoupled from the gate terminal (G) of the MOSFET (100) if a test enable signal mode (TE) is not set.

For a method for monitoring an actual threshold voltage value ($AV_{TH}$) of a MOSFET (100) through a circuit (MC) according to any of the previous embodiments, said method may be summarized as including: receive, through a control unit (400), a test mode signal (TM), indicative of an operation mode, couple or decouple, through the control unit (400), a current source (200) to/from a source terminal(S) of the MOSFET (100) according to said received test mode signal (TM), couple or decouple, through the control unit (400), a voltage generator (404) to/from a gate terminal (G) of the MOSFET (100) according to said received test mode signal (TM), if said current source (200) is coupled to the source terminal(S) of the MOSFET (100), generate a test current ($I_{TEST}$), if said voltage generator (404) is coupled between the gate terminal (G) of the MOSFET (100) and the source terminal(S) of the MOSFET (100), generate a test voltage ($V_{TEST}$), said test voltage ($V_{TEST}$) being lower than a nominal threshold voltage value ($NV_{TH}$) of the MOSFET (100), determine, through the control unit (400), the value of a reference voltage ($V_{REF}$) according to said received test mode signal (TM), determine, through the control unit (400), a condition for detecting an unsuccessful comparison operation according to said received test mode signal (TM), sample, through a detection unit (408-414), a plurality of voltage value ($V_{LOAD}$) at the source terminal(S) of the MOSFET (100) in response to the reception of a signal from the control unit (400) indicating to perform a plurality of said sampling operation according to said received test mode signal (TM), compute, through a detection unit (408-414), a voltage variation as a function of said plurality of voltage value ($V_{LOAD}$), said voltage variation being indicative of changings in said plurality of voltage value ($V_{LOAD}$) over a given time period ($T_d$), compare, through an alarm generation unit (416-418), said computed voltage variation with the reference voltage ($V_{REF}$), and raise, through an alarm generation unit (416-418), an alarm ($AL_{VTH}$) in response to an unsuccessful comparison operation.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit for monitoring a threshold voltage value of a metal oxide semiconductor field effect transistor (MOSFET), the circuit comprising:

a current source configured to be coupled to a source terminal of the MOSFET and to generate a test current;

a voltage generator configured to be coupled between a gate terminal of the MOSFET and the source terminal of the MOSFET, and to generate a test voltage, the test voltage being lower than a nominal threshold voltage value of the MOSFET;

detection circuitry configured to:

sample a plurality of voltage values at the source terminal of the MOSFET, the plurality of voltage values includes a first voltage value and a second voltage value, the first voltage value being retrieved at a beginning of a time period while the second voltage value being retrieved at an end of the time period; and determine, as a function of the plurality of voltage values, a voltage variation over the time period, of the plurality of voltage values at the source terminal of the MOSFET, the determination of the voltage variation includes a subtraction of the second voltage value from the first voltage value;

alarm generation circuitry configured to:

receive the determined voltage variation from the detection circuitry;

compare the determined voltage variation with a reference voltage; and raise an alarm if an output of the comparison of the determined voltage variation with the reference voltage does not correspond to a predetermined output condition; and a controller configured to:

receive a test mode signal indicative of an operation mode;

select, according to the received test mode signal, a status of coupling or decoupling of the current source and the source terminal of the MOSFET to each other;

determine a value of the reference voltage;

set the predetermined output condition; and signal to the detection circuitry to perform a plurality of the sampling of the plurality of voltage values, wherein the detection circuitry includes:

sensing circuitry configured to sense voltage values at the source terminal of the MOSFET, and to forward the sensed voltage values to a first sample and hold block and to a second sample and hold block;

the first sample and hold block configured to sample the first voltage value in response to a reception of a signal from the controller indicating to perform a first of the sampling of the plurality of voltage values, to hold the first voltage value for an amount of time larger than the time period, and to provide the first voltage value to a subtracting block;

the second sample and hold block configured to sample the second voltage value in response to the reception of a signal from the controller indicating to perform a second of the sampling of the plurality of voltage values, to hold the second voltage value, and to provide the second voltage value to the subtracting block; and the subtracting block configured to receive the first voltage value from the first sample and hold block and the second voltage value from the second sample and hold block, to perform the subtraction of the second voltage value from the first voltage value to obtain the voltage variation, and to provide the voltage variation to the alarm generation circuitry.

2. The circuit according to claim 1, wherein if the test mode signal indicates a first mode, the controller is configured to:

decouple the current source from the source terminal of the MOSFET;

determine the value of the reference voltage so that the reference voltage is a positive voltage smaller than a value of the determined voltage variation obtained in case the threshold voltage value is equal to or lower than the test voltage; and set as the predetermined output condition a result of the comparison of the determined voltage variation with the reference voltage indicating that the determined voltage variation is higher than the reference voltage, and if the test mode signal indicates a second mode, the controller is configured to:

couple the current source to the source terminal of the MOSFET;

determine the value of the reference voltage so that the reference voltage is higher than a value of the determined voltage variation obtained in case the threshold voltage value is equal to or lower than the test voltage and smaller than a value of the determined voltage variation obtained in case the threshold voltage value is higher than the test voltage; and set as the predetermined output condition a result of the comparison of the determined voltage variation with the reference voltage indicating that the determined voltage variation is smaller than the reference voltage.

3. The circuit according to claim 2, wherein the test mode signal is configured to indicate a first submode of the first mode and a second submode of the first mode, and the time period in the first submode is shorter than the time period in the second mode.

4. The circuit according to claim 3, wherein the circuit is coupled to an external load through the source terminal of the MOSFET, and the test mode signal selects an operation mode in a set of available operation modes, the set of available operation modes including:

the first mode, selected when the coupled external load is in an off state, the first mode including the first submode corresponding to a resistive load and the second submode corresponding to a load including both a capacitive component and a resistive component, and the second mode, selected when the coupled external load is in an on state or in a standby mode and the coupled external load corresponds to a capacitive load.

5. The circuit according to claim 1, wherein the MOSFET is a Power MOSFET.

6. The circuit according to claim 1, wherein the alarm generation circuitry includes:

a reference voltage generator configured to provide a comparator block with the reference voltage; and the comparator block configured to receive the determined voltage variation from the detection circuitry and the reference voltage from the reference voltage generator, to compare the determined voltage variation with the reference voltage, and to raise an alarm in response to an unsuccessful comparison operation.

7. The circuit according to claim 1, further comprising:

a first switch configured to couple or decouple the current source to the source terminal of the MOSFET in response to a reception of a signal from the controller issued as a function of the test mode signal.

8. The circuit according to claim 1, further comprising:

a switch configured to decouple a gate driver from the gate terminal of the MOSFET in response to a reception of a signal from the controller indicating to start the monitoring of the threshold voltage value, and to couple the gate driver to the gate terminal of the MOSFET in response to a reception of a signal from the controller indicating to end the monitoring of the threshold voltage value.

9. The circuit according to claim 1, wherein the test voltage is fixed, or the test voltage is dynamic and the controller is configured to:

select an initial value for the test voltage;

start the monitoring of the threshold voltage value;

if the alarm generation circuitry does not raise an alarm before an end of the monitoring of the threshold voltage value, increase the value of the test voltage of a given step and repeat the monitoring of the threshold voltage value; and if the alarm generation circuitry raises an alarm before the end of the monitoring of the threshold voltage value, identify a current value of the test voltage as the value of the threshold voltage value.

10. The circuit according to claim 1, wherein the circuit is coupled to temperature monitoring circuitry, the temperature monitoring circuitry being configured to:

monitor a temperature of the MOSFET to sense at least one temperature value;

compute a value for the test voltage as a function of the at least one sensed temperature value; and provide the value for the test voltage to the circuit to generate a test voltage of the value through the voltage generator.

11. The circuit according to claim 2, further comprising:

a switch configured to couple or decouple the voltage generator to the gate terminal of the MOSFET in response to a reception of a signal from the controller issued as a function of the test mode signal, in the first and second mode the voltage generator is maintained coupled to the gate terminal of the MOSFET.

12. The circuit according to claim 11, wherein in the first and second mode the voltage generator is decoupled from the gate terminal of the MOSFET if a test enable signal mode is not set.

13. A method for monitoring a threshold voltage value of a metal oxide semiconductor field effect transistor (MOSFET), the method comprising:

receiving, by a controller, a test mode signal, indicative of an operation mode;

coupling or decoupling, by the controller, a current source and a source terminal of the MOSFET to each other according to the received test mode signal;

coupling or decoupling, by the controller, a voltage generator and a gate terminal of the MOSFET to each other according to the received test mode signal;

if the current source is coupled to the source terminal of the MOSFET, generating a test current;

if the voltage generator is coupled between the gate terminal of the MOSFET and the source terminal of the MOSFET, generating a test voltage that is lower than a nominal threshold voltage value of the MOSFET;

determining, by the controller, a value of a reference voltage according to the received test mode signal;

determining, by the controller, a condition for detecting an unsuccessful comparison operation according to the received test mode signal, sampling, by detection circuitry, a plurality of voltage values at the source terminal of the MOSFET in response to a reception of a signal from the controller indicating to perform the sampling according to the received test mode signal;

determining, by the detection circuitry, a voltage variation as a function of the plurality of voltage values, the determined voltage variation being indicative of changes in the plurality of voltage values over a time period, comparing, by alarm generation circuitry, the determined voltage variation with the reference voltage, and raising, by the alarm generation circuitry, an alarm in response to the unsuccessful comparison operation, wherein if the test mode signal indicates a first mode, the method includes:

decoupling, by the controller, the current source from the source terminal of the MOSFET;

determining, by the controller, the value of the reference voltage so that the reference voltage is a positive voltage smaller than a value of the determined voltage variation obtained in case the threshold voltage value is equal to or lower than the test voltage; and setting, by the controller, a predetermined output condition for detecting the unsuccessful comparison operation, the predetermined output condition being set as a result of the comparing of the determined voltage variation with the reference voltage indicating that the determined voltage variation is higher than the reference voltage, if the test mode signal indicates a second mode, the method includes:

coupling, by the controller, the current source to the source terminal of the MOSFET;

determining, by the controller, the value of the reference voltage so that the reference voltage is higher than a value of the determined voltage variation obtained in case the threshold voltage value is equal to or lower than the test voltage and smaller than a value of the determined voltage variation obtained in case the threshold voltage value is higher than the test voltage; and setting, by the controller, as the predetermined output condition a result of the comparing of the determined voltage variation with the reference voltage indicating that the determined voltage variation is smaller than the reference voltage, and the test mode signal is configured to indicate a first submode of the first mode and a second submode of the first mode, the time period in the first submode is shorter than the time period in the second mode.

14. A device, comprising:

a metal oxide semiconductor field effect transistor (MOSFET);

a first switch coupled to a source of the MOSFET;

a current source coupled to the first switch, the current source configured to generate a test current;

a second switch coupled to a gate of the MOSFET;

a voltage generator coupled to the second switch and the source of the MOSFET, the voltage generator configured to generate a test voltage that is lower than a nominal threshold voltage value of the MOSFET;

detection circuitry configured to sample a plurality of voltage values at the source of the MOSFET, and determine a voltage variation of the plurality of voltage values over a time period;

alarm generation circuitry configured to output an alarm based on the voltage variation and a reference voltage; and temperature monitoring circuitry configured to:

monitor a temperature of the MOSFET to sense at least one temperature value;

compute a value for the test voltage as a function of the at least one sensed temperature value; and provide the value for the test voltage to the voltage generator to generate a test voltage of the value.

15. The device according to claim 14, further comprising:

a controller configured to:

open the first switch such that the current source is decoupled from the source of the MOSFET; and set the reference voltage so that the reference voltage is a positive voltage smaller than a value of the voltage variation obtained in case a threshold voltage of the MOSFET is equal to or lower than the test voltage.

16. The device according to claim 14, further comprising:

a controller configured to:

close the first switch such that the current source is coupled to the source of the MOSFET; and set the reference voltage so that the reference voltage is higher than a value of the voltage variation obtained in case a threshold voltage of the MOSFET is equal to or lower than the test voltage and smaller than a value of the voltage variation obtained in case the threshold voltage is higher than the test voltage.

17. The device according to claim 14, further comprising:

a controller configured to open and close the second switch based on a test mode of the MOSFET.

* * * * *